(12) United States Patent
Nishiyama et al.

(10) Patent No.: US 8,492,184 B2
(45) Date of Patent: Jul. 23, 2013

(54) ORGANIC EL DISPLAY PANEL, DISPLAY DEVICE, AND METHOD OF MANUFACTURING ORGANIC EL DISPLAY PANEL

(75) Inventors: Seiji Nishiyama, Osaka (JP); Tetsuro Kondoh, Osaka (JP)

(73) Assignee: Panasonic Corporation, Osaka (JP)

( * ) Notice: Subject to any disclaimer, the term of this patent is extended or adjusted under 35 U.S.C. 154(b) by 77 days.

(21) Appl. No.: 13/296,725

(22) Filed: Nov. 15, 2011

(65) Prior Publication Data

US 2012/0091439 A1    Apr. 19, 2012

Related U.S. Application Data

(63) Continuation of application No. PCT/JP2010/004984, filed on Aug. 6, 2010.

(51) Int. Cl.
*H01L 21/00* (2006.01)
*H01L 33/00* (2010.01)

(52) U.S. Cl.
USPC ............... 438/35; 438/34; 438/99; 438/956; 257/40; 257/88; 257/89

(58) Field of Classification Search
USPC ............. 438/34, 35, 99, 149, 155, 637–640, 438/956; 257/40, 59, 72, 88, 89; 313/504
See application file for complete search history.

(56) References Cited

U.S. PATENT DOCUMENTS

| 7,244,158 | B2 * | 7/2007 | Kimura et al. ................. 445/24 |
| 7,365,367 | B2 * | 4/2008 | Han et al. ..................... 257/88 |
| 7,374,264 | B2 * | 5/2008 | Okano ........................... 347/12 |
| 7,754,275 | B2 * | 7/2010 | Mitsuhashi et al. ........... 427/66 |
| 8,076,704 | B2 * | 12/2011 | Lee et al. ..................... 257/294 |
| 8,153,459 | B2 * | 4/2012 | Choi ............................. 438/29 |
| 2001/0008788 | A1 | 7/2001 | Hshieh et al. |

(Continued)

FOREIGN PATENT DOCUMENTS

| JP | 2003-022035 | 1/2003 |
| JP | 2003-241683 | 8/2003 |

(Continued)

OTHER PUBLICATIONS

U.S. Appl. No. 13/288,446 to Shinya Ono et al., filed Nov. 3, 2011.
U.S. Appl. No. 13/221,126 to Seiji Nishiyama et al., filed Aug. 30, 2011.

*Primary Examiner* — Fernando L Toledo
*Assistant Examiner* — Bryan Junge
(74) *Attorney, Agent, or Firm* — Greenblum & Bernstein, P.L.C.

(57) ABSTRACT

A device and method improving luminous efficiency and luminescent color in an organic EL display panel used in electronic devices such as televisions or the like by making it easy to adjust the difference in film thickness between layers of different luminescent colors, such as intermediate layers, when the intermediate layers and light-emitting layers are formed by a wet method. By varying by color the volume of a contact hole formed in an interlayer insulation film, which is a lower layer of an organic EL element, the volume of a concavity in each anode plate is adjusted. When ink that includes material for the intermediate layer or the like is sprayed by an inkjet method, the film thickness of the intermediate layer or the like changes in accordance with the amount of ink filing the concavity.

25 Claims, 12 Drawing Sheets

U.S. PATENT DOCUMENTS

| | | |
|---|---|---|
| 2003/0146710 A1 | 8/2003 | Nakanishi |
| 2006/0113897 A1* | 6/2006 | Fukase ................. 313/504 |
| 2010/0213827 A1 | 8/2010 | Yoshida |
| 2011/0115961 A1* | 5/2011 | Moriyama et al. ....... 348/333.01 |
| 2011/0165517 A1 | 7/2011 | Nishiyama et al. |
| 2012/0126252 A1* | 5/2012 | Hermes et al. ............. 257/79 |

FOREIGN PATENT DOCUMENTS

| | | |
|---|---|---|
| JP | 2004514265 | 5/2004 |
| JP | 2005-157300 | 6/2005 |
| JP | 2010-097697 | 4/2010 |
| WO | 2009/084209 | 7/2009 |

* cited by examiner

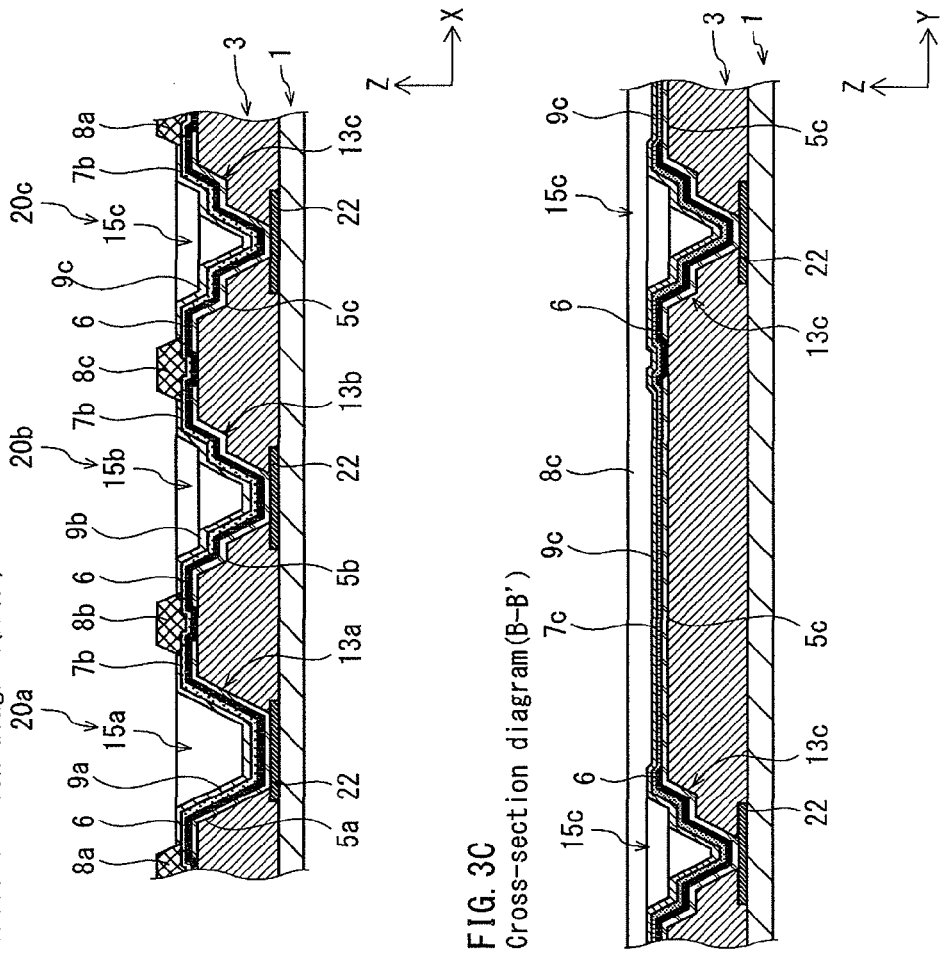
FIG. 3B Cross-section diagram (A-A')
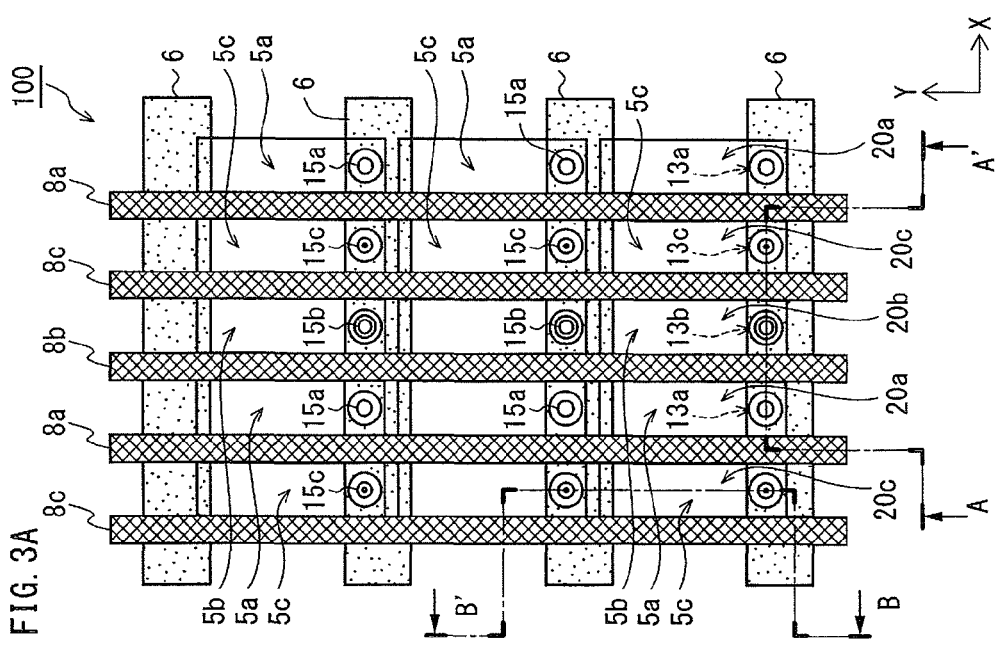
FIG. 3C Cross-section diagram (B-B')
FIG. 3A

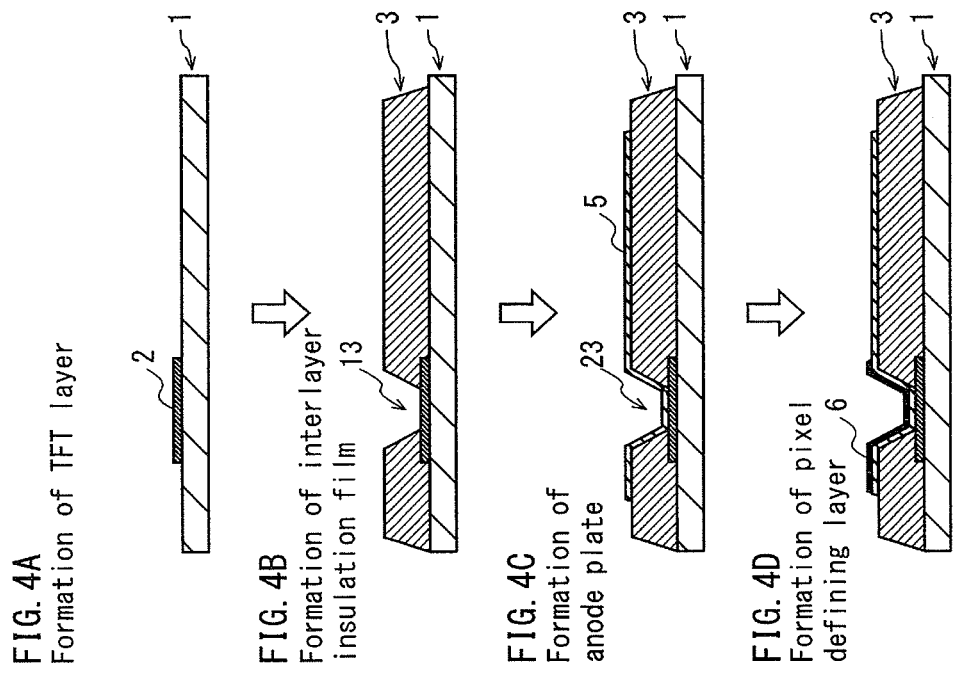
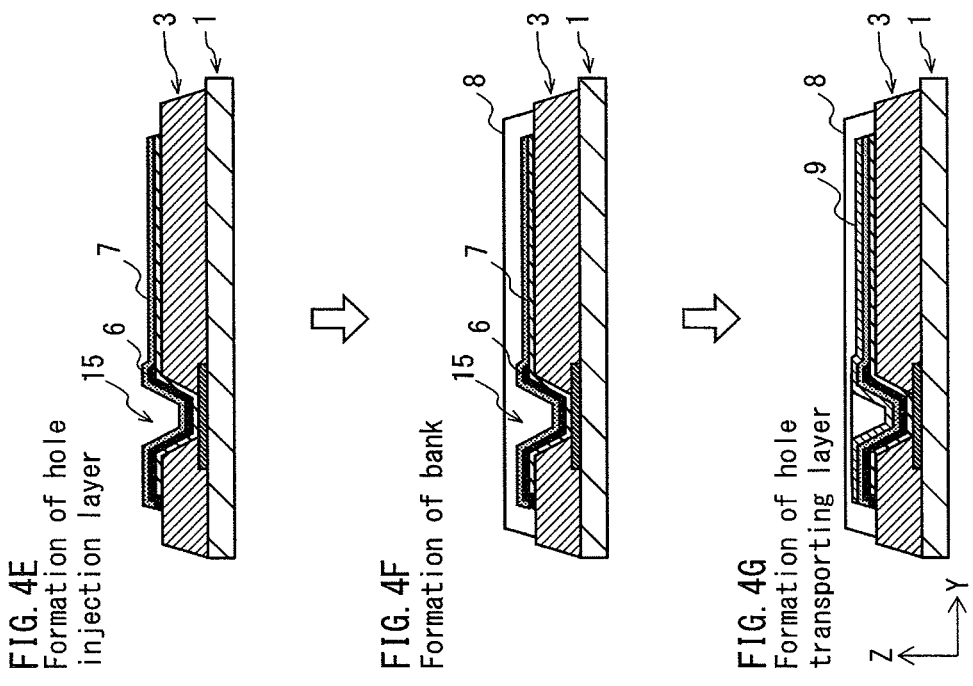

Exposure

Developing

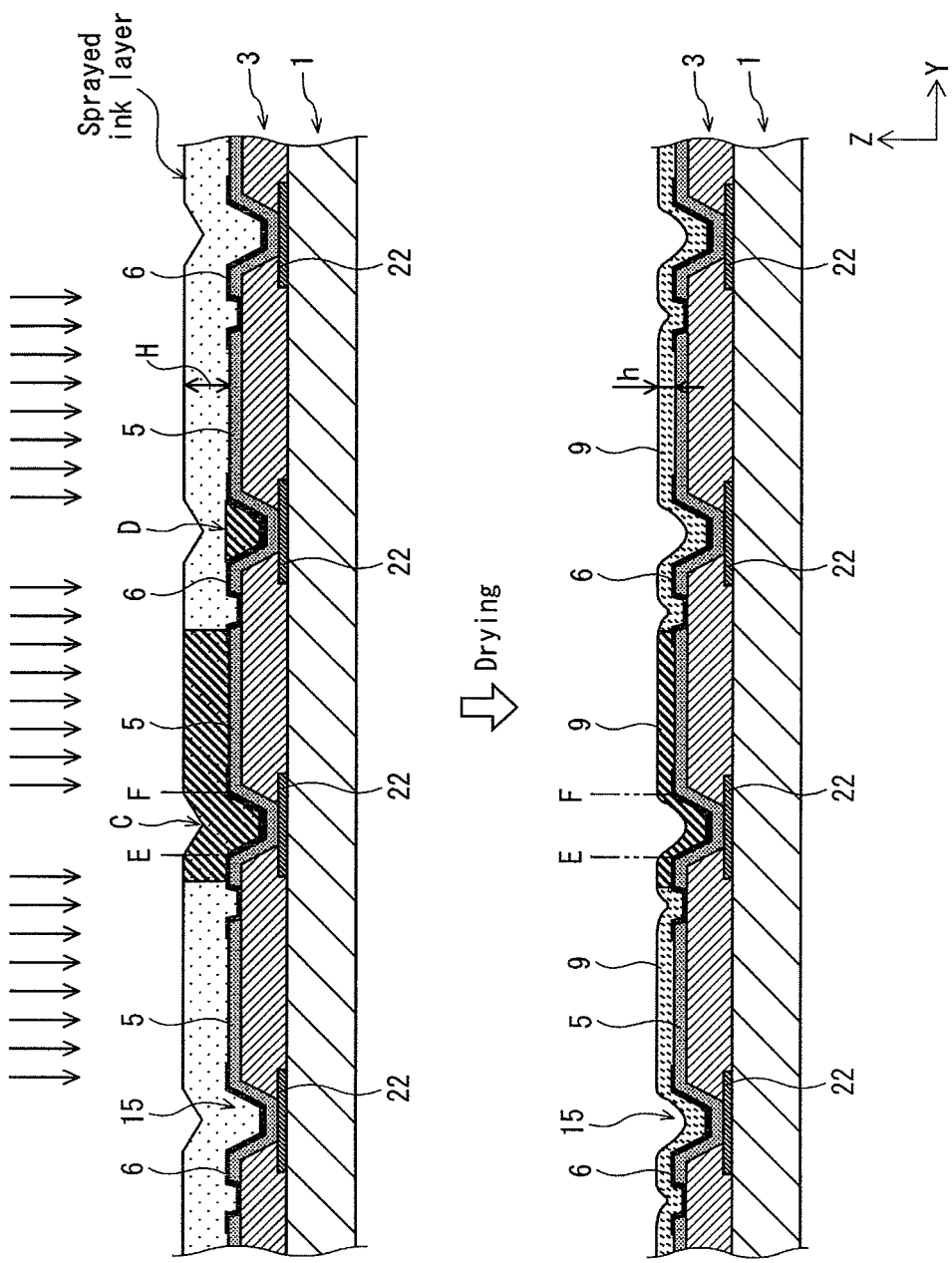

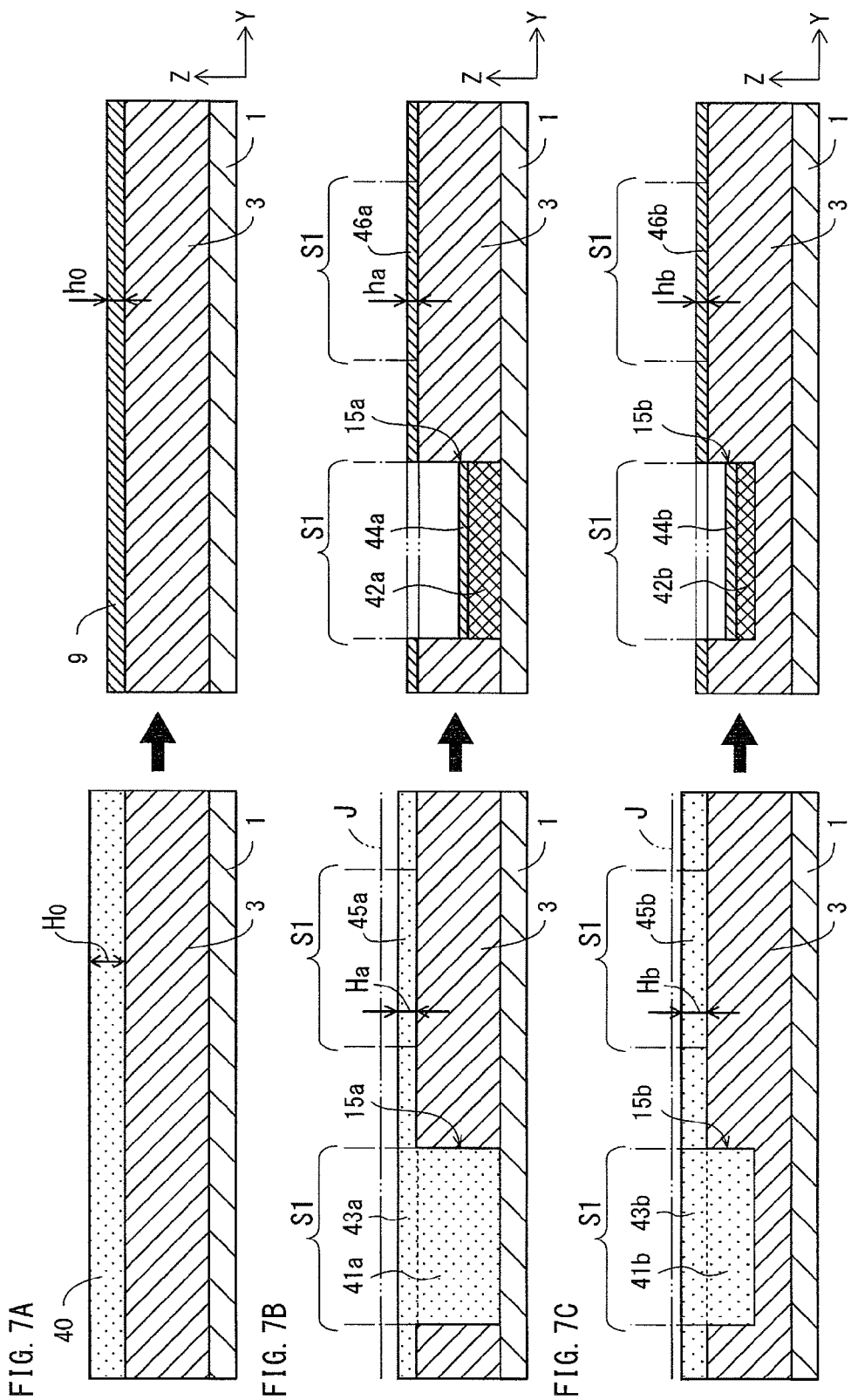

ORGANIC EL DISPLAY PANEL, DISPLAY DEVICE, AND METHOD OF MANUFACTURING ORGANIC EL DISPLAY PANEL

This is a continuation of International Application PCT/JP2010/004984, with an international filing date of Aug. 6, 2010.

TECHNICAL FIELD

The present invention relates to organic electroluminescence (hereinafter, "organic EL") display panels containing a matrix of organic EL elements, to display devices, and to methods of manufacturing organic EL display panels.

BACKGROUND ART

In recent years, organic EL display panels that have a plurality of organic EL elements in rows above a substrate have been used as light-emitting display panels in compact electronic equipment and compact display devices. The basic structure of an organic EL element is to form a light-emitting layer, which includes organic light-emitting material, between a pair of electrodes, i.e. an anode and a cathode. When voltage is applied between the pair of electrodes, holes injected into the light-emitting layer from the anode recombine with electrons injected into the light-emitting layer from the cathode, and as a result, the organic EL element emits light. Since each organic EL element in the organic EL display panel emits light, the light from the display panel is highly visible.

In an organic EL display panel, typically a light-emitting layer is partitioned in each organic EL element by banks (walls) formed from insulating material. These banks define the shape of the light-emitting layer. Between the anode and the light-emitting layer, intermediate layers are provided as necessary, such as a hole-injection layer, hole transporting layer, or hole injection and transporting layer. An electron injection layer, electron transporting layer, or electron injection and transporting layer may also be provided between the cathode and the light-emitting layer as necessary.

In a full-color organic EL display panel, such organic EL elements are formed into sub-pixels whose color is R, G, or B. Three adjacent RGB sub-pixels together constitute one pixel.

In order to form the light-emitting layer or intermediate layers in each organic EL element, banks are formed on the substrate to partition adjacent organic EL elements. Subsequently, an inkjet or other wet method is generally used to spray ink containing high-polymer material or low-molecular material suitable for thin-film formation. With such a wet method, it is relatively easy to form the intermediate layer or light-emitting layer even in large panels.

In an inkjet method (see Patent Literature 1), which is representative of wet methods, inkjet heads are moved across a substrate, on which ink is to be sprayed, in any direction of the matrix of elements while a solution (hereinafter simply "ink") is sprayed by ejecting drops of ink through each nozzle into regions defined by the banks on the substrate. The ink contains organic material and solvent that are for forming the intermediate layers, the light-emitting layer, etc.

CITATION LIST

Patent Literature

Patent Literature 1: Japanese Patent Application Publication No. 2003-241683

SUMMARY OF INVENTION

Technical Problem

The film thickness of the intermediate layers that improves luminous efficiency of each organic EL element depends on the wavelength of the luminescent color. For example, in a top-emission organic EL element, it is preferable that optical path lengths be set so that reflected light and direct light strengthen each other. Reflected light refers to light that is emitted from the light-emitting layer towards the substrate and reflected by an electrode or the like near the substrate before exiting through the light-emitting layer. Conversely, direct light is emitted directly upwards (in the direction opposite the substrate) from the light-emitting layer.

The wavelengths of red, green, and blue light differ, causing the optimal optical path length (resonance condition) inside each organic EL element to differ. Therefore, in order to improve luminous efficiency, it is preferable to finely adjust differences in film thickness of the intermediate layers in the sub-pixel of each luminescent color to match the wavelength of each color.

When the wet method is used to actually form the intermediate layers, however, it is difficult to finely adjust the film thickness of the intermediate layers for each color.

Specifically, the ink that includes material for the intermediate layers is set to be the same for all colors, and the amount of ink provided to each sub-pixel for forming the intermediate layers is set to be constant. For example, when spraying ink for the intermediate layers by the inkjet method, the number of drops of ink ejected into the regions for forming the organic EL element of each color is set to be the same, and the volume of each drop of ink ejected from the nozzle is set to be the same.

It is plausible to adjust the film thickness of the intermediate layers by changing the number of drops of ink dripped into the sub-pixel of each color when using the inkjet method. Since the amount of ink provided to each sub-pixel can only be varied by changing the number of drops of ink, however, it is difficult with this approach to finely adjust the film thickness of the intermediate layers in the sub-pixel of each color.

Furthermore, since the appropriate film thickness of the light-emitting layer for achieving, for example, a desired luminance or chromaticity differs by color, there is a need to finely adjust the difference in film thickness between light-emitting layers of different colors. There is also a need to finely adjust the difference in film thickness in order for the optical path length to match the wavelength of the luminescent color, as is the case with the intermediate layers.

As is clear from the above examples, there is a need in organic EL display panels to finely adjust the difference in film thickness between intermediate layers and light-emitting layers formed by the wet method.

The present invention has been conceived in light of the above problems, and it is an object thereof to make it easy to finely adjust differences in film thickness between intermediate layers, light-emitting layers, etc. of differing luminescent colors in an organic EL display panel in which such layers are formed by the wet method, thereby improving luminous efficiency, luminescent color, etc.

Solution to Problem

In order to solve the above problems, an organic EL display plan according to an aspect of the present invention comprises: a TFT layer; an interlayer insulation film provided above the TFT layer; a first electrode plate group formed in a line on the interlayer insulation film and including a plurality of first electrode plates corresponding to a first color; a second electrode plate group formed in a line on the interlayer insulation film adjacent to the first electrode plate group and including a plurality of second electrode plates corresponding to a second color; a first bank along a longitudinal first edge of the first electrode plate group; a second bank between a longitudinal second edge of the first electrode plate group and a longitudinal first edge of the second electrode plate group; a third bank along a longitudinal second edge of the second electrode plate group; a first organic functional layer between the first bank and the second bank and above the first electrode plate group; a second organic functional layer between the second bank and the third bank and above the second electrode plate group; and a counter electrode disposed to cover both the first organic functional layer and the second organic functional layer, wherein the interlayer insulation film is provided with first contact holes, each connecting one of the first electrode plates with the TFT layer, and second contact holes, each connecting one of the second electrode plates with the TFT layer, each of the first electrode plates has a first concavity shaped in conformity with one of the first contact holes, and each of the second electrode plates has a second concavity shaped in conformity with one of the second contact holes, at least one of (i) all the first contact holes and (ii) all the second contact holes are shaped to become narrower in a stepwise manner, any of the first contact holes has a larger volume than any of the second contact holes, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

A display device according to an aspect of the present invention comprises the above-described organic EL display panel.

A method of manufacturing an organic EL display panel according to an aspect of the present invention comprises the steps of: a first step of preparing a substrate; a second step of forming a TFT layer on the substrate; a third step of forming an interlayer insulation film on the TFT layer; a fourth step of forming, on the interlayer insulation film, a first electrode plate group including a plurality of first electrode plates corresponding to a first color and arranged in a line and a second electrode plate group including a plurality of second electrode plates corresponding to a second color and arranged in a line; a fifth step of forming a first bank along a longitudinal first edge of the first electrode plate group, a second bank between a longitudinal second edge of the first electrode plate group and a longitudinal first edge of the second electrode plate group, and a third bank along a longitudinal second edge of the second electrode plate group; a sixth step of forming a continuous first organic functional layer between the first bank and the second bank and above the first electrode plate group; a seventh step of forming a continuous second organic functional layer between the second bank and the third bank and above the second electrode plate group; and an eighth step of forming a counter electrode to cover both the first organic functional layer and the second organic functional layer, wherein in the third step, the interlayer insulation film is provided with first contact holes, each connecting one of the first electrode plates with the TFT layer, and second contact holes, each connecting one of the second electrode plates with the TFT layer, at least one of (i) all the first contact holes and (ii) all the second contact holes being shaped to become narrower in a stepwise manner, and any of the first contact holes having a larger volume than any of the second contact holes, in the fourth step, each of the first electrode plates is formed to have a first concavity shaped in conformity with one of the first contact holes, and each of the second electrode plates is formed to have a second concavity shaped in conformity with one of the second contact holes, and in the first organic functional layer formed in the sixth step and the second organic functional layer formed in the seventh step, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

Advantageous Effects of Invention

In an organic EL display panel according to an aspect of the present invention, the volume of each first contact hole with respect to the volume of each second contact hole is easily increased by forming at least one of (i) all of the first contact holes and (ii) all of the second contact holes to become narrower in a stepwise manner.

Accordingly, the volume of the first concavity increases with respect to the volume of the second concavity. During formation of an organic functional layer by the wet method, if for example a first organic functional layer and a second organic functional layer formed above electrode plates have the same volume, then an amount of the first organic functional layer that enters into the first concavity is made larger than an amount of the second organic functional layer that enters into the second concavity. As a result, if for example organic functional layers having the same volume are respectively formed above first electrode plates corresponding to a first color and second electrode plates corresponding to a second color, the film thickness of the first organic functional layer corresponding to a region other than the first concavity (for example, a level region) in the first electrode plates is made less than the film thickness of the second organic functional layer corresponding to a region other than the second concavity in the second electrode plates (hereinafter, the former film thickness is simply referred to as the "film thickness of the first organic functional layer", and the latter film thickness as the "film thickness of the second organic functional layer").

The difference between the volume of the first concavity and the volume of the second concavity can be adjusted in smaller increments than the volume of one drop of ink sprayed from a nozzle by the inkjet method. Therefore, finely adjusting the difference between the volume of the first concavity and the volume of the second concavity makes it easy to finely adjust the difference between the film thickness of the first organic functional layer and the film thickness of the second organic functional layer.

This facilitates finely adjusting the difference in film thickness between organic functional layers corresponding to different colors. As a result, it is possible, for example, to appropriately adjust the resonance conditions of light in the organic EL element of each color, making it easy to achieve a display panel with excellent luminous efficiency.

Note that, in order to appropriately adjust the resonance conditions of light in the organic EL element of each color, it is not necessary to adjust the optical path length exclusively by varying the organic functional layer. The film thickness of other layers (such as a transparent electrode layer) may also be adjusted by color.

With the method of manufacturing an organic EL display panel according to an aspect of the present invention, the above organic EL display panel can be manufactured.

BRIEF DESCRIPTION OF DRAWINGS

FIG. 3A is a plan view showing the structure of the display panel 100, FIG. 3B is a cross-section diagram from A to A' in FIG. 3A, and FIG. 3C is a cross-section diagram from B to B' in FIG. 3A.

FIGS. 4A-4G are an illustration of a method of manufacturing the display panel 100.

FIG. 6 is a schematic cross-section diagram showing conditions immediately after spraying ink for forming an intermediate layer on a substrate and after drying the ink.

FIGS. 7A-7C are schematic diagrams illustrating the relationship between the volume of a concavity 15 and the film thickness of a hole transporting layer 9.

DESCRIPTION OF EMBODIMENTS

Aspects of the Invention

Figure 1:
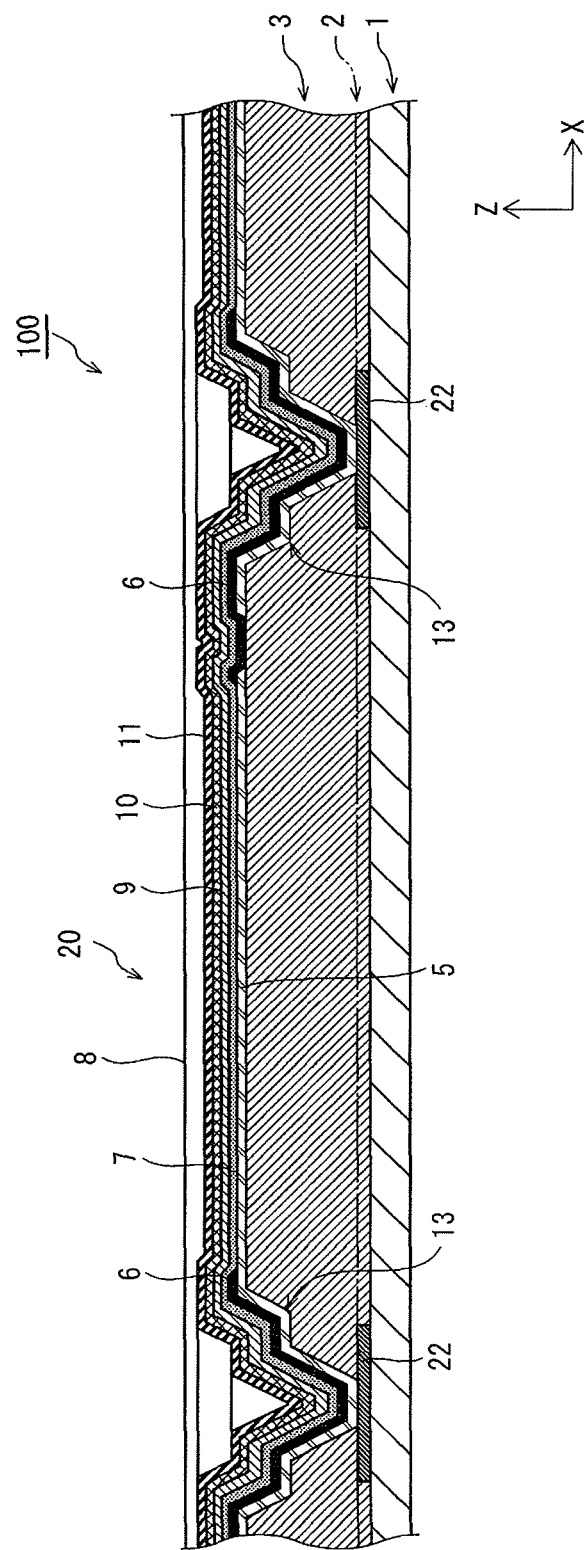
FIG. 1 is a cross-section diagram schematically showing the structure of an organic EL display panel 100 according to the Embodiment.

An organic EL display panel according to an aspect of the present invention comprises: a TFT layer; an interlayer insulation film provided above the TFT layer; a first electrode plate group formed in a line on the interlayer insulation film and including a plurality of first electrode plates corresponding to a first color; a second electrode plate group formed in a line on the interlayer insulation film adjacent to the first electrode plate group and including a plurality of second electrode plates corresponding to a second color; a first bank along a longitudinal first edge of the first electrode plate group; a second bank between a longitudinal second edge of the first electrode plate group and a longitudinal first edge of the second electrode plate group; a third bank along a longitudinal second edge of the second electrode plate group; a first organic functional layer between the first bank and the second bank and above the first electrode plate group; a second organic functional layer between the second bank and the third bank and above the second electrode plate group; and a counter electrode disposed to cover both the first organic functional layer and the second organic functional layer, wherein the interlayer insulation film is provided with first contact holes, each connecting one of the first electrode plates with the TFT layer, and second contact holes, each connecting one of the second electrode plates with the TFT layer, each of the first electrode plates has a first concavity shaped in conformity with one of the first contact holes, and each of the second electrode plates has a second concavity shaped in conformity with one of the second contact holes, at least one of (i) all the first contact holes and (ii) all the second contact holes are shaped to become narrower in a stepwise manner, any of the first contact holes has a larger volume than any of the second contact holes, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

In an organic EL display panel according to an aspect of the present invention, the volume of each first contact hole with respect to the volume of each second contact hole is easily increased by forming at least one of (i) all of the first contact holes and (ii) all of the second contact holes to become narrower in a stepwise manner.

Accordingly, the volume of the first concavity increases with respect to the volume of the second concavity. During formation of an organic functional layer by the wet method, if for example a first organic functional layer and a second organic functional layer formed above electrode plates have the same volume, then an amount of the first organic functional layer that enters into the first concavity is made larger than an amount of the second organic functional layer that enters into the second concavity. As a result, if for example organic functional layers having the same volume are respectively formed above first electrode plates corresponding to a first color and second electrode plates corresponding to a second color, the film thickness of the first organic functional layer corresponding to a region other than the first concavity (for example, a level region) in the first electrode plates is made less than the film thickness of the second organic functional layer corresponding to a region other than the second concavity in the second electrode plates (hereinafter, the former film thickness is simply referred to as the "film thickness of the first organic functional layer", and the latter film thickness as the "film thickness of the second organic functional layer").

The difference between the volume of the first concavity and the volume of the second concavity can be adjusted in smaller increments than the volume of one drop of ink sprayed from a nozzle by the inkjet method. Therefore, finely adjusting the difference between the volume of the first concavity and the volume of the second concavity makes it easy to finely adjust the difference between the film thickness of the first organic functional layer and the film thickness of the second organic functional layer.

This facilitates finely adjusting the difference in film thickness between organic functional layers corresponding to different colors. As a result, it is possible, for example, to appropriately adjust the resonance conditions of light in the organic EL element of each color, making it easy to achieve a display panel with excellent luminous efficiency.

Note that, in order to appropriately adjust the resonance conditions of light in the organic EL element of each color, it is not necessary to adjust the optical path length exclusively by varying the organic functional layer. The film thickness of other layers (such as a transparent electrode layer) may also be adjusted by color.

In this context, appropriate adjustment of the resonance conditions of light in the organic EL elements refers, for example, to the following. If an organic EL display panel is manufactured under the same conditions as the organic EL display panel in the present aspect (dimensions of organic EL elements, amount of sprayed ink, etc.), except with the same volume for the first and second contact holes, the luminous efficiency of the organic EL elements of both the first color and the second color cannot be improved simultaneously. The luminous efficiency of the organic EL elements of both colors can, however, be improved by varying the volume of the first and second contact holes.

The following examples show how the organic EL elements of both the first color and the second color cannot be improved simultaneously when the first and second contact holes have the same volume. If the volume of the first contact hole in the organic EL display panel of the present aspect is decreased to match the volume of the second contact hole, the luminous efficiency of the organic EL element of the first color decreases. Conversely, if the volume of the second contact hole is increased to match the volume of the first contact hole, the luminous efficiency of the organic EL element of the second color decreases.

The same can be said when appropriately adjusting the luminescent color of the organic EL elements of each color. Note that each luminescent color is appropriately adjusted by, for example, improving the color purity of the luminescent color.

The above "volume of the first contact hole" may be substituted by the "volume of the first concavity", and the above "volume of the second contact hole" may be substituted by the "volume of the second concavity".

The contact holes that become narrower in a stepwise manner may, for example, be formed by exposing, with a half-tone mask, and then developing the interlayer insulation film in which the contact holes are to be formed. The number of steps, the width of each step, and the depth of the contact holes that become narrower in a stepwise manner may be freely set. The step may be formed in only part of the inner periphery of the contact hole or along the entire inner periphery.

Note that even if layers other than the organic functional layer (such as a pixel defining layer) are formed on the electrode plates, the difference in film thickness between organic functional layers can be finely adjusted if the other layers enter into and adopt the shape of the concavity.

In this context, stating that "the volume of a portion of the first organic functional layer above any of the first electrode plates is equal to, or an approximation of, the volume of a portion of the second organic functional layer above any of the second electrode plates" refers to the volume of the first organic functional layer and the volume of the second organic functional layer being substantially equal (within tolerance range). Numerically speaking, the difference in volume between the first and second organic functional layers is within a range of 10%, inclusive, of the volume of the first organic functional layer.

In the present aspect, the difference between the volume of the first concavity and the volume of the second concavity may be larger than the volume of a drop of ink (for example, 1.5 times the volume of the drop).

Note that it is preferable that the difference between the volume of the first organic functional layer and the volume of the second organic functional layer be less than the volume of the first organic functional layer that accumulates in the first concavity minus the volume of the second organic functional layer that accumulates in the second concavity.

In this context, "a region other than the first concavity in any of the first electrode plates" refers, for example, to level regions in the first electrode plates, in plan view, excluding the region where the first concavity is formed (which may include a region surrounding the first concavity). Specifically, this region may, for example, be located in the light-emitting region in plan view. The same is true for the region above any of the second electrode plates.

In the present aspect, "above" refers to being farther away from the TFT layer in the direction of lamination of the organic functional layer and other layers.

Note that even if layers other than the organic functional layer (such as a pixel defining layer) are formed on the electrode plates, the difference in film thickness between organic functional layers can be finely adjusted if the other layers enter into and adopt the shape of the concavity.

In the organic EL display panel according to the above aspect of the present invention, a size of an upper opening of each of the first contact holes may be equal to, or an approximation of, a size of an upper opening of each of the second contact holes.

With the above structure, even if the size of the upper opening of the first contact hole and the size of the upper opening of the second contact hole are equal, or an approximation of each other, the volume of the first contact hole is made larger than the volume of the second contact hole by forming a step in at least one of the first contact hole and the second contact hole. Specifically, a step is provided in the inside of the second contact hole, for example, and the volume of the portion below the step surface is reduced so that the volume of the second contact hole is less than the volume of the first contact hole. As a result, the difference between the film thickness of the first organic functional layer and the film thickness of the second organic functional layer is finely adjusted.

Furthermore, by making the size of the upper opening of the first and second contact holes substantially equal, the area of the opening of the first and second concavities becomes substantially equal. This allows the sprayed ink to enter into the concavities with roughly equal ease.

Note that the size of the upper opening may be considered to be the area of the opening of the contact hole at the upper surface of the interlayer insulation film, or the area of the opening of the contact hole in a cross-section of an upper part of the contact hole, cut perpendicular to the direction of lamination of the organic functional layer and other layers. The upper part of the contact hole refers, for example, to any position between the highest part of the periphery of the contact hole and a position 15% lower than the highest part in terms of the depth of the contact hole.

Equal to, or an approximation of refers to the size of the upper opening of the first contact hole and the size of the upper opening of the second contact hole being substantially equal (within tolerance range). Numerically speaking, this means that the difference between the size of the upper opening of the first contact hole and the size of the upper opening of the second contact hole is within 10%, inclusive, of the size of the upper opening of the first contact hole.

In the organic EL display panel according to the above aspect of the present invention, the size of the upper opening of any contact hole may be the area of a circle defined by a diameter of the contact hole at a position 10%, or an approximation of 10%, lower than a height of a highest position of the interlayer insulation film along a periphery of the contact hole.

With the above structure, the contact hole is a circle in plan view, with the size of the upper opening being defined by a diameter of the contact hole at a position 10%, or an approximation of 10%, lower than a highest position of the periphery of the contact hole. Accordingly, if the shape or the height of the contact hole is irregular at or near the highest position of the periphery of the contact hole, the effect of such irregularity is reduced. Note that an approximation of 10% refers to being, for example, in a range between 9% and 11%.

The organic EL display panel according to the above aspect of the present invention may further comprise: a first pixel defining layer covering the first concavity, the first organic functional layer being formed above the first pixel defining layer; and a second pixel defining layer covering the second concavity, the second organic functional layer being formed above the second pixel defining layer.

With the above structure, a pixel defining layer that has insulating properties covers the concavity, thereby electrically insulating the concavity and the organic functional layer. This prevents a local concentration of current from causing the light-emitting layer to emit light at a different luminance by, for example, the rim of the concavity than in a region near the concavity.

The first pixel defining layer and second pixel defining layer are formed, for example, from an oxide (including a nitride) such as a film of silicon dioxide ($SiO_7$), silicon nitride (SiN), silicon oxynitride (SiON), etc. The first organic functional layer and the second organic functional layer have high wettability with respect to the oxide, such as a SiO film or a SiN film. When ink including material for the organic functional layers is sprayed directly on the pixel defining layers, the first and second organic functional layers easily enter the first and second concavities respectively.

This is even more advantageous for finely adjusting the difference in film thickness between organic functional layers corresponding to different colors.

In the organic EL display panel according to the above aspect of the present invention, the first organic functional layer may be continuous above the first electrode plate group due to ink drops of a predetermined volume being sprayed via an inkjet method, the second organic functional layer may be continuous above the second electrode plate group due to ink drops of the predetermined volume, or an approximation of the predetermined volume, being sprayed via the inkjet method, and the volume of the portion of the first organic functional layer above any of the first electrode plates may be equal to, or an approximation of, the volume of the portion of the second organic functional layer above any of the second electrode plates.

With the above structure, when the organic functional layers are formed, the volume of ink drops sprayed by the inkjet method are substantially equal (for example, the difference in volumes being within a tolerance range of 10%) when forming both the first and the second organic functional layers. Furthermore, the volume of the first organic functional layer and the volume of the second organic functional layer are equal, or an approximation of each other (for example, the difference in volumes being within a tolerance range of 10%), and the number of drops sprayed in a region above each electrode plate is the same.

As described above, since the volume of each first contact hole is larger than the volume of each second contact hole, the film thickness of the first organic functional layer in a region other than the first concavity in any of the first electrode plates is less than the film thickness of the second organic functional layer in a region other than the second concavity in any of the second electrode plates.

With the above structure, therefore, the same spraying conditions are maintained when using the inkjet method, which simplifies both manufacturing equipment and the manufacturing process. Furthermore, since the volume of the first contact hole is larger than the volume of the second contact hole, the film thickness of the first organic functional layer is less than the film thickness of the second organic functional layer. In other words, the difference in film thickness between organic functional layers corresponding to different colors is finely adjusted.

Conventionally, when forming an organic functional layer of an organic EL light-emitting element by the inkjet method, the number of shots of the inkjet apparatus (for example, the number of ink drops per sub-pixel) is adjusted for each color, R, G, and B, to adjust the film thickness of each organic functional layer. As a result, it is difficult to finely adjust the film thickness. For example, if 10 drops of organic ink for forming the organic functional layer are dripped into a region corresponding to an electrode plate of a first color, the film thickness increases by 1.1 times (approximately 10%) if the number of shots is changed to 11 drops. In other words, film thickness cannot be varied by less than 10% with such an inkjet apparatus. Accordingly, the difference in film thickness between organic functional layers corresponding to different colors cannot be finely adjusted.

When the organic functional layer is an intermediate layer, the same material is used in each color, R, G, and B. In this case, to adjust the difference in film thickness between organic functional layers corresponding to different colors, it becomes necessary to control the number of shots from R, G and B nozzles in the inkjet apparatus, thus complicating the apparatus.

By contrast, with the above structure the volume of the first organic functional layer and the volume of the second organic functional layer are substantially equal. The difference in volume between contact holes can be set, for example, to 1.5 times the amount of an ink drop, so as to finely adjust the film thickness between organic functional layers even when the number of shots is the same for each color. In other words, with the above structure, the film thickness corresponding to each luminescent color, R, G, and B, can be finely adjusted at will, even when the inkjet apparatus sprays the same amount of ink when forming the organic functional layer for each color.

Moreover, the inkjet apparatus sprays ink corresponding to each luminescent color from all of the nozzles under the same spraying conditions. This renders it unnecessary to control the nozzles corresponding to each luminescent color in the inkjet apparatus, thereby simplifying control of the apparatus.

As a result, the film thickness of the organic functional layers is finely adjusted by adjusting the volume of the concavities, while maintaining the volume of a portion of the first organic functional layer above any of the first electrode plates equal to, or an approximation of, the volume of a portion of the second organic functional layer above any of the second electrode plates.

In the organic EL display panel according to the above aspect of the present invention, a difference between the film thickness of the first organic functional layer and the film thickness of the second organic functional layer may be larger than an additional film thickness of the first organic functional layer when a number of ink drops of the predetermined volume sprayed on each of the first electrode plates via the inkjet method is increased by n drops, and smaller than an additional film thickness of the first organic functional layer when the number of ink drops is increased by n+1 drops.

With the above structure, the difference between the film thickness of the first organic functional layer in a region other than the first concavity in any of the first electrode plates and the film thickness of the second organic functional layer in a region other than the second concavity in any of the second electrode plates is finely adjusted in increments that are smaller than the film thickness of a layer formed by one ink drop, the smallest unit for spraying by the nozzles of the inkjet apparatus (for example, in increments of one half of an ink drop). Note that n is an integer greater than or equal to zero ($n \geq 0$).

The additional film thickness of the first organic functional layer when the number of ink drops is increased by n drops may be the increase in the film thickness of the first organic functional layer due to n ink drops. Similarly, the additional film thickness of the first organic functional layer when the number of ink drops is increased by n+1 drops may be the increase in the film thickness of the first organic functional layer due to n+1 ink drops.

In the organic EL display panel according to the above aspect of the present invention, the first color may be blue.

Organic EL light-emitting elements may adopt a cavity structure, in which for example the optical path length of reflected light, which is emitted at the side of the counter electrode after being reflected at the side of the electrode plate, is matched to the wavelength of each color of light, so that the reflected light interferes with and strengthens direct light emitted from the light-emitting layer at the side of the counter electrode. When the organic functional layer forms part of this cavity structure, it is preferable for the film thickness of the blue organic functional layer to be made thin. This is because, among the wavelengths of red (R), green (G), and blue (B) light, the wavelength of blue light is the shortest, making it preferable for the corresponding optical path length to be the shortest.

With the above structure, the first color is blue. Therefore, the film thickness of the blue organic functional layer is made less than the organic functional layers of other luminescent colors. This yields, for example, organic EL light-emitting elements of various colors with excellent light takeoff efficiency (light takeoff efficiency referring to the ratio of the number of photons exiting the organic EL light-emitting element to the number of photons produced within the organic EL light-emitting element).

The organic EL display panel according to the above aspect of the present invention may further comprise a third electrode plate group adjacent to the second electrode plate group and including a plurality of third electrode plates corresponding to a third color and arranged in a line; a fourth bank along a longitudinal edge of the third electrode plate group opposite the second electrode plate group; and a third organic functional layer between the third bank and the fourth bank and above the third electrode plate group; wherein the counter electrode is provided above the third organic functional layer, the interlayer insulation film is provided with third contact holes, each connecting one of the third electrode plates with the TFT layer, each of the third electrode plates has a third concavity shaped in conformity with one of the third contact holes, the third contact holes are shaped to become narrower in a stepwise manner, any of the first contact holes has a larger volume than any of the third contact holes, the volume of a portion of the first organic functional layer above any of the first electrode plates is equal to, or an approximation of, the volume of a portion of the third organic functional layer above any of the third electrode plates, and an amount of the first organic functional layer that has entered into the first concavity is larger than an amount of the third organic functional layer that has entered into the third concavity, so that a film thickness of the first organic functional layer in a region other than the first concavity in any of the first electrode plates is less than a film thickness of the third organic functional layer in a region other than the third concavity in any of the third electrode plates.

With the above structure, an organic EL light-emitting element corresponding to the third electrode plate group is provided in addition to the organic EL light-emitting elements corresponding to the first and second electrode plate groups. This achieves an organic EL display panel that displays images in three luminescent colors. Setting the three colors to be red, green, and blue (RGB) yields an extremely versatile organic EL display panel.

With the above structure, setting the volume of the third contact hole to be different from the volume of the second contact hole allows for the volume of the contact hole to be different for each color, R, G, and B. In the sub-pixel of each color, R, G, and B, the above cavity structure is normally adopted in order to improve light takeoff efficiency. In this case, it is preferable to finely adjust the difference in film thickness between organic functional layers to yield an optical path length that optimally matches the wavelength of each color, R, G, and B.

The above structure allows for the volume of the contact holes to be finely adjusted easily by determining conditions such as exposure, washing, curing, etc. when forming the contact holes. This makes it possible to finely adjust the difference in film thickness between functional organic layers.

Therefore, when the organic functional layers are formed by the inkjet method, the difference in film thickness between the organic functional layers that appropriately adjusts the cavity in each sub-pixel is finely adjusted by changing the volume of the contact holes formed for each color, R, G, and B.

In particular, the volume of the contact holes can be made smaller in order from B to G to R (B>G>R) in order to appropriately adjust the cavity corresponding to the emission wavelength of each color, R, G, and B. By doing so, the film thickness of the organic functional layers can be made to increase from B to G to R (B<G<R). Note that since layers other than the organic functional layer are included in the cavity, the film thickness of the organic functional layer corresponding to each color, R, G, and B, may be varied via the film thickness of such other layers.

In the organic EL display panel according to the above aspect of the present invention, a size of an upper opening of each of the first contact holes, a size of an upper opening of each of the second contact holes, and a size of an upper opening of each of the third contact holes may be equal to, or an approximation of, each other.

With the above structure, even when the size of the upper opening of the contact holes for each color is substantially equal, the film thickness of the organic functional layers is finely adjusted via the shape of the contact holes.

In the organic EL display panel according to the above aspect of the present invention, the size of the upper opening of any contact hole may be the area of a circle defined by a diameter of the contact hole at a position 10% lower than a height of a highest position of the interlayer insulation film along a periphery of the contact hole.

In the organic EL display panel according to the above aspect of the present invention, the first organic functional layer and the second organic functional layer may both be one of a charge injection layer and a charge transport layer, a first organic light-emitting layer may be formed between the first organic functional layer and the counter electrode, and a second organic light-emitting layer may be formed between the second organic functional layer and the counter electrode.

In the organic EL display panel according to the above aspect of the present invention, the first organic functional layer, the second organic functional layer, and the third organic functional layer may all be one of a charge injection layer and a charge transport layer, a first organic light-emitting layer may be formed between the first organic functional layer and the counter electrode, a second organic light-emitting layer may be formed between the second organic functional layer and the counter electrode, and a third organic light-emitting layer may be formed between the third organic functional layer and the counter electrode.

In the organic EL display panel according to the above aspect of the present invention, the first organic functional layer and the second organic functional layer may each be an organic light-emitting layer.

With the above structure, the difference in film thickness between organic light-emitting layers corresponding to the various colors is finely adjusted by making the volume of the first contact hole larger than the volume of the second contact hole. This results in more appropriate chromaticity, luminance, etc. for the organic light-emitting layers. Alternatively, the light takeoff efficiency may be improved.

In the organic EL display panel according to the above aspect of the present invention, the first organic functional layer, the second organic functional layer, and the third organic functional layer may each be an organic light-emitting layer.

In the organic EL display panel according to the above aspect of the present invention, the electrode plates may be anodes, and the counter electrode may be a cathode.

In the organic EL display panel according to the above aspect of the present invention, the electrode plates may be cathodes, and the counter electrode may bean anode.

A display device according to an aspect of the present invention comprises any of the above organic EL display panels.

The above structure achieves a display device provided with any of the above organic EL display panels.

A method of manufacturing an organic EL display panel according to an aspect of the present invention comprises the steps of: a first step of preparing a substrate; a second step of forming a TFT layer on the substrate; a third step of forming an interlayer insulation film on the TFT layer; a fourth step of forming, on the interlayer insulation film, a first electrode plate group including a plurality of first electrode plates corresponding to a first color and arranged in a line and a second electrode plate group including a plurality of second electrode plates corresponding to a second color and arranged in a line; a fifth step of forming a first bank along a longitudinal first edge of the first electrode plate group, a second bank between a longitudinal second edge of the first electrode plate group and a longitudinal first edge of the second electrode plate group, and a third bank along a longitudinal second edge of the second electrode plate group; a sixth step of forming a continuous first organic functional layer between the first bank and the second bank and above the first electrode plate group; a seventh step of forming a continuous second organic functional layer between the second bank and the third bank and above the second electrode plate group; and an eighth step of forming a counter electrode to cover both the first organic functional layer and the second organic functional layer, wherein in the third step, the interlayer insulation film is provided with first contact holes, each connecting one of the first electrode plates with the TFT layer, and second contact holes, each connecting one of the second electrode plates with the TFT layer, at least one of (i) all the first contact holes and (ii) all the second contact holes being shaped to become narrower in a stepwise manner, and any of the first contact holes having a larger volume than any of the second contact holes, in the fourth step, each of the first electrode plates is formed to have a first concavity shaped in conformity with one of the first contact holes, and each of the second electrode plates is formed to have a second concavity shaped in conformity with one of the second contact holes, and in the first organic functional layer formed in the sixth step and the second organic functional layer formed in the seventh step, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

The above structure allows for manufacturing of an organic EL display panel according to the above aspect of the present invention. Accordingly, by finely adjusting the difference in the volume of the first contact hole and the second contact hole, for example, the difference between the film thickness of the first organic functional layer and the film thickness of the second organic functional layer is finely adjusted. As a result, it is possible, for example, to appropriately adjust the resonance conditions of light in the organic EL element of each color, making it easy to achieve a display panel with excellent luminous efficiency.

In the method of manufacturing an organic EL display panel according to the above aspect of the present invention, a size of an upper opening of each of the first contact holes may be formed equal to, or an approximation of, a size of an upper opening of each of the second contact holes.

The above structure allows for manufacturing of an organic EL display panel according to the above aspect of the present invention. Accordingly, even if for example the size of the upper opening of the first contact hole and the size of the upper opening of the second contact hole are equal, or an approximation of each other, the volume of the first contact hole is made larger than the volume of the second contact hole by forming a step in at least one of the first contact hole and the second contact hole so that the contact holes have different shapes.

This facilitates finely adjusting the difference in film thickness between organic functional layers corresponding to different colors. As a result, it is possible, for example, achieve a display panel with excellent luminous efficiency.

Furthermore, by making the size of the upper opening of the first and second contact holes substantially equal, the area of the opening of the first and second concavities becomes substantially equal. This allows the ink, which includes material for the organic functional layer, to enter into the concavities with roughly equal ease.

The method of manufacturing an organic EL display panel according to the above aspect of the present invention may further comprise, between the fourth step and the fifth step, an additional step of: forming a first pixel defining layer to cover the first concavity, and a second pixel defining layer to cover the second concavity, wherein in the sixth step, the first organic functional layer is formed above the first pixel defining layer, and in the seventh step, the second organic functional layer is formed above the second pixel defining layer.

With the above structure, a pixel defining layer that has insulating properties covers the concavity, thereby electrically insulating the concavity and the organic functional layer. This prevents a local concentration of current from causing the light-emitting layer to emit light at a different luminance by, for example, the rim of the concavity than in a region near the concavity.

The first pixel defining layer and second pixel defining layer are formed, for example, from an oxide (including a nitride) such as a SiO, film, a SiN film, etc. When ink including material for the organic functional layers is sprayed directly on the pixel defining layers, the first and second organic functional layers easily enter the first and second concavities respectively.

In the method of manufacturing an organic EL display panel according to the above aspect of the present invention, in the sixth step, the first organic functional layer may be formed to be continuous above the first electrode plate group due to ink drops of a predetermined volume being sprayed via an inkjet method, and in the seventh step, the second organic functional layer may be formed to be continuous above the second electrode plate group due to ink drops of the predetermined volume, or an approximation of the predetermined volume, being sprayed via the inkjet method.

With the above structure, the same spraying conditions for each color are maintained when using the inkjet method, which simplifies both manufacturing equipment and the manufacturing process. Furthermore, since the volume of the first contact hole is larger than the volume of the second contact hole, the film thickness of the first organic functional layer is less than the film thickness of the second organic functional layer. In other words, the difference in film thickness between organic functional layers corresponding to different colors is finely adjusted.

In the method of manufacturing an organic EL display panel according to the above aspect of the present invention, a difference between the film thickness of the first organic functional layer and the film thickness of the second organic functional layer may be larger than an increase in the film thickness of the first organic functional layer when a number of ink drops of the predetermined volume sprayed on each of the first electrode plates via the inkjet method is increased by n drops, and smaller than the increase in the film thickness of the first organic functional layer when the number of ink drops is increased by n+1 drops.

With the above structure, the difference between the film thickness of the first organic functional layer and the film thickness of the second organic functional layer is finely adjusted in increments that are smaller than the film thickness of a layer formed by one ink drop, the smallest unit for spraying by the nozzles of the inkjet apparatus. Note that the film thickness of the first organic functional layer refers to the film thickness of a portion of the first organic functional layer corresponding to a region other than the first concavity in any of the first electrode plates. The same is true for the film thickness of the second organic functional layer.

In the method of manufacturing an organic EL display panel according to the above aspect of the present invention, the first organic functional layer and the second organic functional layer may both be one of a charge injection layer and a charge transport layer, a first organic light-emitting layer may be formed between the first organic functional layer and the counter electrode, and a second organic light-emitting layer may be formed between the second organic functional layer and the counter electrode.

In the method of manufacturing an organic EL display panel according to the above aspect of the present invention, the first organic functional layer and the second organic functional layer may each be an organic light-emitting layer.

A method of manufacturing an organic EL display panel according to an aspect of the present invention comprises the steps of: a first step of preparing a substrate; a second step of forming a TFT layer on the substrate; a third step of forming an interlayer insulation film on the TFT layer; a fourth step of forming, on the interlayer insulation film, a first electrode plate group including a plurality of first electrode plates corresponding to a first color and arranged in a line, a second electrode plate group including a plurality of second electrode plates corresponding to a second color and arranged in a line, and a third electrode plate group including a plurality of third electrode plates corresponding to a third color and arranged in a line; a fifth step of forming a first bank along a longitudinal first edge of the first electrode plate group, a second bank between a longitudinal second edge of the first electrode plate group and a longitudinal first edge of the second electrode plate group, a third bank between a longitudinal second edge of the second electrode plate group and a longitudinal first edge of the third electrode plate group, and a fourth bank along a longitudinal second edge of the third electrode plate group; a sixth step of forming a continuous first organic functional layer between the first bank and the second bank and above the first electrode plate group; a seventh step of forming a continuous second organic functional layer between the second bank and the third bank and above the second electrode plate group; an eighth step of forming a continuous third organic functional layer between the third bank and the fourth bank and above the third electrode plate group; and a ninth step of forming a counter electrode disposed to cover the first organic functional layer, the second organic functional layer, and the third organic functional layer, wherein in the third step, the interlayer insulation film is provided with first contact holes, each connecting one of the first electrode plates with the TFT layer, second contact holes, each connecting one of the second electrode plates with the TFT layer, and third contact holes, each connecting one of the third electrode plates with the TFT layer, at least two of (i) all the first contact holes, (ii) all the second contact holes, and (iii) all the third contact holes being shaped to become narrower in a stepwise manner, and any of the first contact holes having a larger volume than any of the second contact holes and any of the third contact holes, in the fourth step, each of the first electrode plates is formed to have a first concavity shaped in conformity with one of the first contact holes, each of the second electrode plates is formed to have a second concavity shaped in conformity with one of the second contact holes, and each of the third electrode plates is formed to have a third concavity shaped in conformity with one of the third contact holes, and in the first organic functional layer formed in the sixth step, the second organic functional layer formed in the seventh step, and the third organic functional layer formed in the eighth step, the volume of a portion of the first organic functional layer above any of the first electrode plates is equal to, or an approximation of, the volume of a portion of the second organic functional layer above any of the second electrode plates and the volume of a portion of the third organic functional layer above any of the third electrode plates, and an amount of the first organic functional layer that has entered into the first concavity is larger than both an amount of the second organic functional layer that has entered into the second concavity and an amount of the third organic functional layer that has entered into the third concavity, so that a film thickness of the first organic functional layer in a region other than the first concavity in any of the first electrode plates is less than both a film thickness of the second organic functional layer in a region other than the second concavity in any of the second electrode plates and a film thickness of the third organic functional layer in a region other than the third concavity in any of the third electrode plates.

With the above structure, an organic EL light-emitting element corresponding to the third electrode plate group is provided in addition to the organic EL light-emitting elements corresponding to the first and second electrode plate groups. This achieves organic EL light-emitting elements of three different luminescent colors. Setting the three colors to be red, green, and blue (RGB) yields an organic EL display panel with excellent light takeoff efficiency.

In the organic EL display panel according to the above aspect of the present invention, the contact hole may have a top opening and a bottom opening respectively at an upper surface and a bottom surface of the interlayer insulation film, and in the concavity shaped in conformity with the contact hole, each of the electrode plates may be electrically connected to the TFT layer through the bottom opening of the contact hole.

In the organic EL display panel according to the above aspect of the present invention, the contact hole may have an upper portion and a lower portion, the upper portion continuously decreasing in diameter from the top opening towards the bottom opening, and the lower portion continuously increasing in diameter from the bottom opening towards the top opening, and a step (or a step face) may exist between the upper portion and the lower portion.

EMBODIMENT

Structure of Display Panel 100

Figure 2:
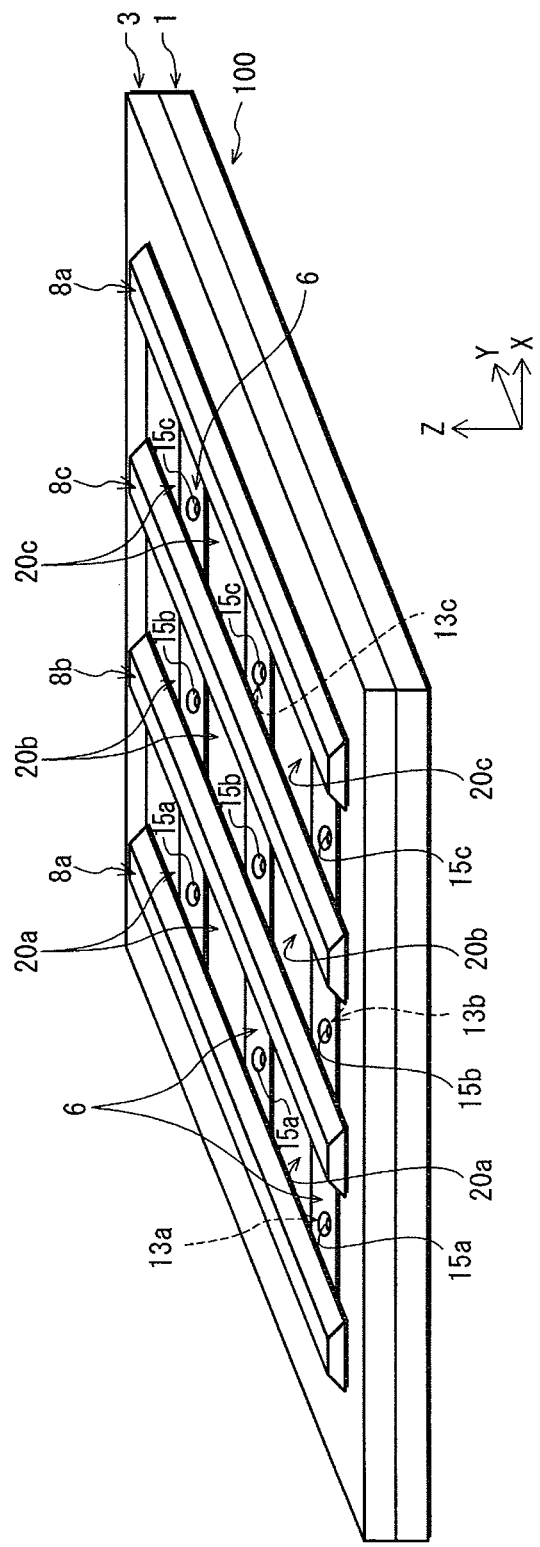
FIG. 2 is a perspective view showing the structure of the display panel 100.

FIG. 1 is a cross-section diagram schematically showing the structure of the main parts of a display panel 100 according to the Embodiment. FIG. 2 is a perspective view showing the structure of the main parts of the display panel 100.

The display panel unit 100 is an organic EL display panel that uses the phenomenon of electroluminescence occurring in organic material. Pixels are arranged in a matrix in the lateral and longitudinal (X and Y) directions in the display panel 100. Each pixel is formed by three adjacent sub-pixels whose colors are respectively red, green, and blue (RGB). The organic EL elements 20a, 20b, and 20c shown in FIG. 2 are top-emission type EL elements. The organic EL elements 20a are sub-pixels of a first color (blue), the organic EL elements 20b are sub-pixels of a second color (green), and organic EL elements 20c are sub-pixels of a third color (red).

The region in which each organic EL element 20 is formed in plan view is referred to as an "element-formation region". Within each element-formation region, the region that emits light is referred to as a "sub-pixel".

As shown in FIG. 2, the blue organic EL elements 20a, green organic EL elements 20b, and red organic EL elements 20c are arranged in longitudinal lines (in the direction of the Y axis) in this order. Three organic EL elements 20a, 20b, and 20c that are contiguous laterally (in the direction of the X axis) form one pixel.

FIG. 1 shows a cross-section of an organic EL element 20c cut out longitudinally (in the direction of the Y axis). The display panel 100 is provided with a thin-film transistor (TFT) substrate formed by a substrate 1 and a TFT layer 2 layered on the principal surface of the substrate 1.

An interlayer insulation film 3, anode plates 5, pixel defining layers 6, and hole-injection layers 7 are layered on the TFT substrate in the display panel 100 in this order. Furthermore, banks 8, hole transporting layers 9, organic light-emitting layers 10 (hereinafter simply "light-emitting layers"), and a cathode layer 11 are formed thereabove, thus forming the organic EL elements 20a, 20b, and 20c.

Note that in FIG. 1, at the top of the figure in the direction of the Z axis, the side of a bank 8 that is at the back of the cross-section is shown in white (the same being true for FIGS. 3B and 3C as well). Note also that in FIG. 2, the hole transporting layers 9, light-emitting layers 10, and cathode layer 11 are not shown.

The substrate 1 forms the base of the display panel 100 and is formed with an insulating material such as alkalifree glass, soda glass, nonfluorescent glass, phosphate glass, borate glass, quartz, acrylic resin, styrenic resin, polycarbonate resin, epoxy resin, polyethylene, polyester, silicone resin, alumina, etc.

The TFT layer 2 includes thin-film transistors (TFT), wiring lines, etc. The TFTs are for driving the organic EL elements 20a-20c in the entire panel by an active matrix method. In FIG. 1, the TFT layer 2 is shown schematically by a line with alternate long and two short dashes, and SD electrodes 22 connected to the source electrodes and the drain electrodes of the TFTs are shown representatively.

The interlayer insulation film 3 is formed from an organic material with excellent insulating properties such as polyimide, polyamide, or acrylic resin and covers the entire TFT layer 2 of the substrate 1.

Contact holes 13a, 13b, and 13c are bored in the direction of thickness (direction of Z axis) of the interlayer insulation film 3 at each respective organic EL element 20a, 20b, and 20c (see FIGS. 1, 3A-3C). The contact holes 13 are circular holes with an opening at the top surface and at the bottom surface of the interlayer insulation film 3. The contact holes 13a, 13b, and 13c are also referred to simply as contact holes 13, without differentiating therebetween. Note that in addition to being circular, the cross-sectional shape of the contact holes 13 (the shape of a cross-section parallel to the XY plane) may be elliptical, rectangular, etc.

As a result of the anode plates 5, pixel defining layers 6, and hole-injection layers 7 being layered in the contact holes 13 in accordance with the concave shape thereof, the hole-injection layers 7 have concavities 15 with a similar shape to the contact holes 13. In FIG. 2, the contact holes 13 are hidden below the concavities 15. Therefore, a dashed lead line indicates the reference numbers for the contact holes 13 (the same being true for FIG. 3A as well).

Next, the structure of the display panel 100 is described in detail with reference to FIGS. 3A-3C. FIG. 3A is a plan view showing the structure of the display panel 100, FIG. 3B is a cross-section diagram from A to A' in FIG. 3A, and FIG. 3C is a cross-section diagram from B to B' in FIG. 3A. Note that in FIG. 3A as well, the hole transporting layers 9, light-emitting layers 10, and cathode layer 11 are not shown.

As shown in FIGS. 3B and 3C, the majority of the upper surface of the interlayer insulation film 3 is level, but the upper surface is concave where the contact holes 13 are formed.

As shown in FIG. 3A, the contact holes 13 are arranged in lines in the same way as the organic EL elements 20. The contact holes 13 are arranged near each other laterally (in the direction of the X axis) and with a predetermined distance between each other longitudinally (in the direction of the Y axis), i.e. at an even pitch.

As shown in FIG. 3B, the sizes of the upper openings of the contact holes 13a, 13b, and 13c corresponding to each color are substantially equal (details on the size of the upper opening are provided below). On the other hand, the contact holes 13a, 13b, and 13c have differing shapes and volumes. Specifically, the contact hole 13a is formed without steps, and a lateral cross-section of the contact hole 13a continuously becomes narrower closer to the bottom surface (the side with the SD electrodes) of the interlayer insulation film 3. By contrast, the contact holes 13b and 13c each have a step surface 14, and a lateral cross-section of each of the contact holes 13b and 13c becomes narrower in a stepwise manner upon approaching the bottom surface of the interlayer insulation film 3.

A lower portion of each of the contact holes 13b and 13c (portion that is lower than the step surface 14) has a smaller diameter than the contact hole 13a, and the contact holes 13b and 13c have a smaller total volume than the contact hole 13a. Furthermore, the contact hole 13c has a smaller volume than the contact hole 13b.

In other words, the volumes of the contact holes 13a, 13b, and 13c corresponding to the colors blue, green, and red are set so that the contact hole 13a corresponding to the color blue has the largest volume, and the contact hole 13c corresponding to the color red has the smallest volume. As a result, the volume of the concavity 15a that forms in the blue element-formation region is the largest, and the volume of the concavity 15c that forms in the red element-formation region is the smallest.

The anode plates 5 (5a-5c) are an example of electrode plates and are rectangular in plan view. The anode plates 5 are formed on the interlayer insulation film 3 in the element-formation region of each of the organic EL elements 20 (in the sub-pixel regions and the regions above the contact holes 13). The anode plates 5 are equal in size and are arranged longitudinally (in the direction of the Y axis) and laterally (in the direction of the X axis) in lines at intervals of a predetermined distance.

As shown in FIGS. 3B and 3C, part of each anode plate 5 is formed along the inner surface of the contact hole 13, thus having a concavity 23 with a shape similar to the contact hole 13. Along the bottom wall of the concavity 23, the anode plate 5 is electrically connected to the SD electrode 22 in the TFT layer 2.

The anode plates 5 are formed from a metal material, such as silver-palladium-copper alloy, Ag (silver), a silver-rubidium-gold alloy, MoCr (alloy of molybdenum and chromium), NiCr (alloy of nickel and chromium), aluminum, an aluminum alloy, etc. The anode plates are preferably light-reflective. A semiconductor material such as Indium Tin Oxide (ITO), IZO ($In_2O_3$—ZnO), ZnO, InO, SnO, etc. may also be used. Furthermore, the above semiconductor material may be layered on the above metal material to form the anode plates 5.

The pixel defining layers 6 are electrically insulating films extending laterally (in the direction of the X axis) that cover the concavities 23 and the longitudinal edges (in the direction of the Y axis) of the anode plates 5.

In the areas where the pixel defining layers 6 are foamed, electrical conduction between the anode plates 5 and the cathode layer 11 is cut off. Therefore, even if a driving voltage is applied on the organic EL elements 20 in these areas, no light is emitted. Therefore, the pixel defining layers 6 partition a plurality of sub-pixels longitudinally (in the direction of the Y axis). The pixel defining layers 6 have equal widths and are arranged at an even pitch so that each of the sub-pixels will be of a uniform size longitudinally (in the direction of the Y axis).

By covering the concavities 23 and the edges of the anode plates 5, the pixel defining layers 6 prevent the uneven luminance described below, as well as the occurrence of a short between the anode plates 5 and the cathode layer 11.

Specifically, the film thickness of the light-emitting layer 10 becomes thin at the edges of the anode plates 5 and by the rim of the concavities 23. If current accumulates locally in these areas, a local increase in luminance may occur, resulting in uneven luminance. Furthermore, if the light-emitting layers 10 or other layers become discontinuous at the edges of the anode plates 5 or by the rim of the concavities 23, a short may occur between the anode plates 5 and the cathode layer 11.

The pixel defining layers 6 are an insulating, inorganic film formed from silicon oxide (SiO), silicon nitride (SiN), silicon oxynitride (SiON), etc. The thickness is approximately 100 nm-300 nm.

The hole-injection layers 7 (7a-7c) are formed from an oxide of molybdenum or tungsten and are layered on the anode plates 5 and the pixel defining layers 6.

In the region above the contact holes 13, the hole-injection layers 7 enter the concavities 23 in the anode plates 5 along with the pixel defining layers 6, thus forming concavities 15 with the same shape as the concavities 23. Note that the film thicknesses of the pixel defining layers 6 and the hole-injection layers 7 are much smaller than the size of the concavities 23 (the diameter and the depth thereof). Therefore, the volume of the concavities 15 formed in the hole-injection layers 7 is approximately the same as the volume of the concavities 23 formed in the anode plates 5.

The banks 8 (8a-8c) are formed from an organic material with insulating properties (such as acrylic resin, polyimide resin, novolac-type phenolic resin, etc.) and at least the surface thereof is provided with repellency. The banks 8a, 8b, and 8c are formed in long, longitudinal lines (in the direction of the Y axis) with equivalent lateral pitch (in the direction of the X axis), so as to exist between organic EL elements 20a, 20b, and 20c that are contiguous laterally. The cross-sectional shape of each bank 8a, 8b, and 8c is a trapezoid, and the width (the dimension in the direction of the X axis) of each bank is uniform.

The hole transporting layers 9 (9a-9c) are an example of the organic functional layer and are formed in the areas between contiguous banks 8, so as to cover the hole-injection layers 7. The hole-injection layers 9 partially fill the concavities 15 in the pixel defining layers 6. The hole transporting layers 9 are formed to be continuous longitudinally (in the direction of the Y axis).

Note that, as described below, the volume of the concavities 15 differs in accordance with differences in the volume of the contact holes 13a, 13b, and 13c which correspond to the different colors, and therefore the film thickness of the hole transporting layers 9 differs in the light-emitting areas, etc.

Between a bank 8a and a bank 8b, a hole transporting layer 9a corresponding to the color blue is formed. Between the bank 8b and a bank 8c, a hole transporting layer 9b corresponding to the color green is formed. Between the bank 8c and the bank 8a, a hole transporting layer 9c corresponding to the color red is formed.

The light-emitting layers 10 (10a-10c) are formed above the hole transporting layers 9, in the areas between contiguous banks 8. The light-emitting layers 10 partially fill the concavities 15 along with the hole transporting layers 9.

A light-emitting layer 10a that emits blue light is formed above the hole transporting layer 9a. A light-emitting layer 10b that emits green light is formed above the hole transporting layer 9b. A light-emitting layer 10c that emits red light is formed above the hole transporting layer 9c.

The hole transporting layers 9 are made from material with excellent hole mobility and transport holes to the light-emitting layers 10. Examples of the material used to form the hole transporting layers 9 include triarylamine-based compounds such as 4-4'-Bis [N-(naphthyl)-N-phenyl-amino] biphenyl (α-NPB or α-NPD), N,N'-Bis (3-methylphenyl)-(1,1'-biphenyl)-4,4'-diamine (TPD), etc. Other examples include a biphenyl derivative, an anthracene derivative, an aniline derivative, a theophene derivative, etc.

Note that the anode plates 5, hole-injection layers 7, and hole transporting layers 9 are formed from the same material for the three colors of organic EL elements 20a, 20b, and 20c, whereas the light-emitting layers 10 are formed from light-emitting materials that emit light of different colors, namely blue, green, and red, respectively for the organic EL elements 20a, 20b, and 20c.

Examples of the material in the light-emitting layers 10 include a fluorescent material such as an oxinoid compound, perylene compound, coumarin compound, azacoumarin compound, oxazole compound, oxadiazole compound, perinone compound, pyrrolo-pyrrole compound, naphthalene compound, anthracene compound, fluorene compound, fluoranthene compound, tetracene compound, pyrene compound, coronene compound, quinolone compound and azaquinolone compound, pyrazoline derivative and pyrazolone derivative, rhodamine compound, chrysene compound, phenanthrene compound, cyclopentadiene compound, stilbene compound, diphenylquinone compound, styryl compound, butadiene compound, dicyanomethylene pyran compound, dicyanomethylene thiopyran compound, fluorescein compound, pyrylium compound, thiapyrylium compound, selenapyrylium compound, telluropyrylium compound, aromatic aldadiene compound, oligophenylene compound, thioxanthene compound, anthracene compound, cyanine compound, acridine compound, metal complex of a 8-hydroxyquinoline compound, metal complex of a 2-bipyridine compound, complex of a Schiff base and a group three metal, metal complex of oxine, rare earth metal complex, etc., as recited in Japanese Patent Application Publication No. H5-163488.

The cathode layer 11 is an example of an opposing electrode and is formed to cover all of the light-emitting layers 10 of the three colors of organic EL elements 20a, 20b, and 20c. The cathode layer 11 is formed from a transparent material, such as ITO, indium zinc oxide (IZO), etc.

Note that, while not shown in the figures, a passivation layer is provided above the cathode layer 11. The passivation layer is formed from a transparent material such as silicon nitride (SiN), silicon oxynitride (SiON), etc.

In the display panel 100, the pitch and width of the banks 8 are uniform, as are the pitch and width of the pixel defining layers 6. Therefore, the size of the sub-pixels surrounded by the banks 8 and the pixel defining layers 6 is also uniform.

In the present Embodiment, as shown in FIG. 3A, a plurality of anode plates 5a for the color blue are arranged in a longitudinal line (in the direction of the Y axis) in the display panel 100, thus forming a first anode plate group (an example of the first electrode plate group). Next to the first anode plate group, a plurality of anode plates 5b for the color green are arranged in a longitudinal line (in the direction of the Y axis), thus forming a second anode plate group (an example of the second electrode plate group). Next to the second anode plate group, a plurality of anode plates 5c for the color red are arranged in a longitudinal line (in the direction of the Y axis), thus forming a third anode plate group (an example of the third electrode plate group).

In FIG. 3A, each anode plate group overall has a long, thin rectangular shape extending longitudinally (in the direction of the Y axis). Each anode plate group has two long sides, one to the left and one to the right. Along one long side (the left side) of the first anode plate group, a first bank (bank 8a) is formed. Between the other long side (the right side) of the first anode plate group and one long side (the left side) of the second anode plate group, a second bank (bank 8b) is formed. Between the other long side (the right side) of the second anode plate group and one long side (the left side) of the third anode plate group, a third bank (bank 8c) is formed. Along the other long side (the right side) of the third anode plate group, a fourth bank (bank 8a) is formed. Note that the fourth bank (bank 8a) becomes the first bank (bank 8a) for the neighboring pixel.

(Method of Manufacturing Display Panel 100)

First, an example of the main parts of a method of manufacturing the display panel 100 is described with reference to FIGS. 4A-4G.

The following describes the process of manufacturing the TFT substrate.

The substrate 1 is prepared in accordance with the size of the display panel 100. Alternatively, a substrate that is several times the size of the display panel 100 may be prepared, and a plurality of display panels 100 may be manufactured at the same time.

Formation of TFT Layer

A known method of manufacturing (for example, as recited in Japanese Patent Application Publication No. 2003-241683, Japanese Patent Application Publication No. 2008-300611, etc.) is used to form the TFT layer 2, which includes TFTs, wiring lines, and SD electrodes 22, on the substrate 1 (FIG. 4A). For example, the TFTs, SD electrodes 22, wiring lines, etc. may be formed by a sputtering method, by a chemical vapor deposition (CVD) method, etc.

During formation of the TFTs, gate electrodes, gate insulation films, sources, drains, and channel layers are formed. The SD electrodes 22 are each formed in electrical connection with either a source or a drain. The wiring lines are formed by a plurality of signal lines extending along the Y axis and a plurality of scanning lines extending along the X axis. The wiring lines are connected to the TFTs. Note that the TFTs may be top-gate TFTs with the gate electrode formed as the source above the drain and other components, or the TFTs may be bottom-gate TFTs with the gate electrode formed as the source below the drain and other components.

The following describes the process of manufacturing the interlayer insulation film.

Formation of Interlayer Insulation Film

A resist film 26 formed by positive photosensitive organic material is first applied to the TFT layer 2, and contact holes 13 are then formed at locations above the SD electrodes 22 in the resist film 26.

The resist film 26 is applied by a liquid film formation method such as spin coating. The surface of the TFT layer 2 is planarized by filling in surface irregularities. Note that the resist film 26 may alternatively be applied by another liquid film formation method such as dip coating, slit coating, spray coating, roll coating, or dye coating.

Photolithography is used to form the contact holes 13. An upper portion and a lower portion are respectively formed above and below the step surfaces 14b and 14c in the respective contact holes 13b and 13c (see FIGS. 5A and 5B). The upper portion and lower portion are formed via two separate exposure and developing processes. For example, after forming the upper portion, the opening of which has a larger diameter, by a first exposure and developing process, the lower portion, the opening of which has a smaller diameter, is formed by a second exposure and developing process.

Figure 5A:
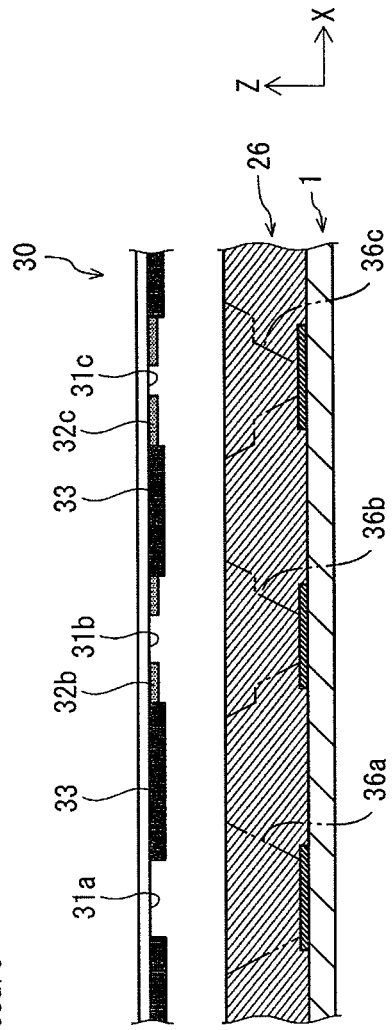
FIGS. 5A and 5B are diagrams illustrating a formation process of an interlayer insulation film in the display panel 100.
Figure 5B:
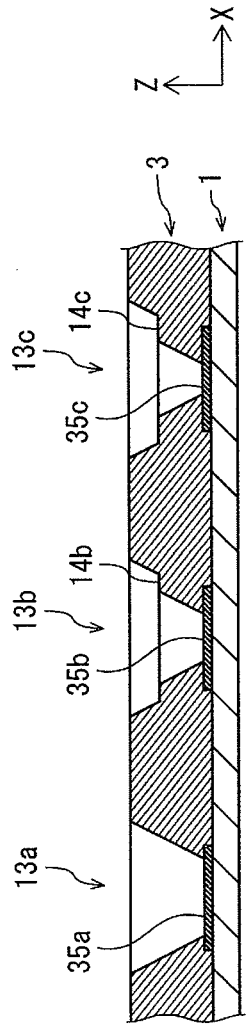

Note that the contact holes 13b and 13c may also be formed via one exposure and developing process using a multi-tone mask. Use of a multi-tone mask is described with reference to FIGS. 5A and 5B. FIGS. 5A and 5B are cross-section diagrams schematically showing processing to form the contact holes 13 by photolithography.

A multi-tone mask 30 used for exposure is formed by a transparent portion 31 that lets light pass through, a semi-transparent portion 32 that weakens passing light, and a light blocking portion 33 that blocks light. The semi-transparent portion 32 may be arranged in patterns with much finer detail than the resolution of an exposure device, and the degree of transparency may be adjusted by adjusting the number of detailed patterns per unit of area. Alternatively, the degree of transparency may be adjusted by further layering a film with a predetermined degree of transparency. Intermediate exposure is achieved with this sort of semi-transparent portion 32. In particular, when varying the volume of the contact hole 13 for each color, R, G, and B, it is preferable for the multi-tone mask 30 to be arranged in patterns with much finer detail than the resolution of the exposure device, and for the degree of transparency to be adjusted by adjusting the number of detailed patterns per unit of area.

In order to form the contact holes 13, the diameter of the opening of each of the transparent portions 31a, 31b, and 31c is approximately the same as the diameter of the corresponding openings 35a, 35b, and 35c (openings at the side of the substrate 1) at the bottom of the contact holes 13a, 13b, and 13c, respectively. The outer diameter of the semi-transparent portions 32b and 32c are set approximately equal to the outer diameter of the step surfaces 14b and 14c (i.e. to the bottom surface of the upper portions) in the respective contact holes 13b and 13c. The portion of the multi-tone mask 30 other than the transparent portion 31 and the semi-transparent portion 32 is the light blocking portion 33.

The degree of transparency of the transparent portion 31 is high. Therefore, after developing, the bottom surface of the resist film 26 is exposed at the portions of the resist film 26 where light passed through the transparent portion 31. By contrast, light shone on the resist film 26 is weakened by the semi-transparent portion 32. Therefore, the upper part of areas exposed to light passing through the semi-transparent portion 32 is then removed by developing to form the step surfaces 14b and 14c. The range indicated schematically by the line with alternate long and two short dashes 36a, 36b, and 36c in FIG. 5A receives light during exposure with the multi-tone mask 30 and is removed by being dissolved during developing. Note that light passing through the transparent portion 31 and the semi-transparent portion 32 spreads by diffraction. Therefore, portions of the resist film 26 that are larger than the transparent portion 31 and the semi-transparent portion 32 are exposed to light to some extent, making the side wall of the contact holes 13 inclined.

Alternatively, after forming an insulation film whose top surface is planarized, the locations where the contact holes are to be formed may be removed by etching, thus forming the contact holes 13.

A specific explanation follows. A photoresist is overlaid on the interlayer insulation film, and thereabove, a pattern mask matching the contact hole 13 to be formed is overlaid. For the contact holes 13b and 13c, which each have a step, a separate pattern mask for the upper portion and a separate pattern mask for the lower portion are necessary. On the other hand, for the contact hole 13a, which has no step, the same pattern mask as for the lower portion of the contact holes 13b and 13c may be used.

Next, after receiving light through the pattern mask, the light-sensitive (or non light-sensitive) portion of the photoresist is removed by developing to form the resist pattern. Subsequently, the portions of the insulation film exposed to the openings of the resist pattern are removed by, for example, wet etching (or dry etching), thus forming the upper portion (lower portion, contact hole 13a) in the insulation film. The insulation film is pattered by performing this sort of exposure and developing twice, thus forming the interlayer insulation film 3.

The following describes the process of forming the organic EL elements of each color.

Formation of Anode Plates

A thin film, approximately 100 nm to 200 nm thick, of a metal material (alloy of silver, palladium, and copper) is formed on the interlayer insulation film 3, and a thin film, approximately 90 nm thick, of semiconducting material (IZO) is formed on the metal material layer.

The anode plates 5, which are rectangular in plan view, are then formed in lines by photolithography. Specifically, a resist film is formed on the semiconducting material. The resist film is exposed to light using a mask pattern in which rectangular anode plate shapes are arranged in lines. The exposed part is then removed by being dissolved in tetramethylammonium hydroxide (TMAH). Furthermore, via wet etching (for example, with a water solution of phosphate, nitric acid, and acetic acid), lattice-shaped portions of the metal material film and the semiconducting material film that are not covered by the resist film are removed and patterning is performed to form the rectangular anode plates 5.

The anode plates 5 at this point are also formed on the inner surface of the contact holes 13. Therefore, the anode plates 5 are concave in conformity with the inner surface of the contact holes 13, and concavities 23 are formed in the anode plates 5. The bottom wall of the concavities 23 is in surface contact with and electrically connected to the SD electrodes 22 through the opening at the bottom of the contact holes 13 (FIG. 4C).

Formation of Pixel Defining Layers

Next, a 100 nm to 300 nm film of SiON is formed by CVD. Using photolithography, the pixel defining layers 6 are then formed through patterning by dry etching (FIG. 4E).

Formation of Hole-Injection Layers

Next, on the anode plates 5 and the pixel defining layers 6, a metal oxide film such as molybdenum oxide, tungsten oxide, etc. is formed by reactive sputtering, thus forming the hole-injection layers 7 (FIG. 4D).

The pixel defining layers 6 and hole-injection layers 7 also have a partially concave shape, along the concavities 23a, 23b, and 23c in the anode plates 5. As a result, concavities 15a, 15c, and 15c are formed in the hole-injection layers 7.

The pixel defining layers 6 and the hole-injection layers 7 have approximately the same film thickness in the sub-pixels and in the concavities 23.

Formation of Banks

Next, resist material is sprayed on the interlayer insulation film 3 as bank material and patterned via photolithography to form the banks 8a, 8b, and 8c (FIG. 4F). The resist material is, for example, a photoresist, or resist material that includes fluorine-based or acrylic material.

Note that, during this process of forming the banks, the surface of the banks 8 may be treated with an alkaline solution, water, or an organic solvent, or by plasma treatment, in order to provide the surface of the banks 8 with repellency with respect to the next ink to be sprayed.

Formation of Hole Transporting Layers

Next, the hole transporting layers 9 are formed by an inkjet method (inkjet spraying method) (FIG. 4G).

To do so, the organic material for the hole transporting layer is mixed with solvent at a predetermined ratio to manufacture hole transporting layer ink. This ink is then sprayed between adjacent banks 8. Specifically, ink is sprayed using a known inkjet method in the regions between bank 8a (the first bank) and bank 8b (the second bank), between bank 8b and bank 8c (the third bank), and between bank 8c and bank 8a (the fourth bank).

FIG. 6 is a schematic cross-section diagram showing conditions immediately after spraying ink for forming the hole transporting layers on the substrate and after drying the ink. Note that in FIG. 6, the hole-injection layers 7 are omitted.

As shown by the arrows in FIG. 7, ink is dripped in a predetermined number of locations in each element-formation region from the nozzles of the inkjet apparatus. In other words, the number of drops (for example, eight) dripped in each element-formation region and the number of locations in which ink is dripped in each element-formation region is made uniform. As a result, the ink that is sprayed covers the entire surface of the hole-injection layers 7, also entering the concavities 15 that exist due to the contact holes 13.

Since the amount of each drop of ink ejected from the nozzle is constant, a uniform amount of ink is sprayed into element-formation regions. In other words, the amount of ink sprayed on each anode plate 5 is equivalent, with variation equal to or less than 5%.

Note that alternative methods for filling the regions between banks with ink that forms the hole transporting layers 9 include a dispenser method, nozzle coating method, printing method, etc. In all of these methods, the amount of ink sprayed on each anode plate 5 and hole-injection layer 7 is equivalent for sub-pixels of each color.

By drying the ink layers thus formed, the hole transporting layers 9 form.

Formation of Light-Emitting Layers

On the hole transporting layers 9, the light-emitting layers 10 are formed by the wet method. This process is the same as the above process of forming the hole transporting layers. Organic light-emitting material for forming the light-emitting layers is dissolved to yield ink. The ink is sprayed between adjacent banks 8 and dried to form the light-emitting layers. The organic light-emitting material that is used differs by luminescent color.

Note that light-emitting layers 10 formed from low-molecular organic light-emitting material may be formed on the hole transporting layers 9 by, for example, a vacuum deposition method. Alternative methods for filling the regions between banks with ink that forms the light-emitting layers 10 include the dispenser method, nozzle coating method, printing method, etc.

Formation of Cathode Layer, Etc.

Next, on the surface of the light-emitting layers 10, a film of ITO, IZO, etc. material is formed by the sputtering method or the vacuum deposition method. The cathode layer 11 is thus formed. Furthermore, on the surface of the cathode layer 11, a film of silicon nitride (SiN), silicon oxynitride (SiON), etc. material is formed by the sputtering method or the vacuum deposition method to form the passivation layer.

All of the organic EL elements 20a-20c are formed by the above processes, thus completing the display panel 100.

Volume of Contact Holes 13 and Concavities 15, Film Thickness of Hole Transporting Layers 9

In the display panel 100, the volume of the contact holes 13 is set so that the volume of the contact hole 13a, corresponding to the color blue, is the largest, and the volume of the contact hole 13c, corresponding to the color red, is the smallest (13a>13b>13c). Accordingly, the volume of the concavities 15 varies, the volume of the concavity 15a formed above the contact hole 13a being the largest, and the volume of the concavity 15c formed above the contact hole 13c being the smallest (15a>15b>15c). The hole transporting layers 9a, 9b, and 9c corresponding to the different colors are set to have the same volume in the regions above the anode plates 5. However, the volume (amount) of each hole transporting layer that enters into the concavities 15a, 15b, and 15c differs.

As a result, the film thickness of the hole transporting layer 9a in the blue sub-pixel (the film thickness in the region above the anode plate 5 in a region other than the concavity 15) is the thinnest, the film thickness of the hole transporting layer 9b in the green sub-pixel is an intermediate thickness, and the film thickness of the hole transporting layer 9c in the red sub-pixel is the thickest.

By thus varying the volume of the concavities 15a, 15b, and 15c, the difference in film thickness between the hole transporting layers 9a, 9b, and 9c is finely adjusted. Accordingly, in the display panel 100, it is easy to set the film thickness of the hole transporting layers 9 to be appropriate for the wavelength of the luminescent color in each sub-pixel.

The following is a detailed consideration of the relationship between the volume of the concavities 15 formed above the anode plates 5 and the film thickness of the hole transporting layers 9. Note that strictly speaking, the concavities 15 are formed by the hole-injection layers 7 entering into the concavities 23 formed on the anode plates 5 and thus adopting the shape of the concavities 23. Since the pixel defining layers 6 and the hole-injection layers 7 are formed by CVD or by the sputter method, the concavities 15 have an extremely similar shape to the concavities 23. As compared to the size of the concavities 23 (diameter and depth), the film thickness of the hole-injection layers 7 and other layers is much smaller, and these layers therefore have little effect on the volume of the concavities 23.

As is clear from the above considerations, it poses no particular problem to consider the concavities 23 and the concavities 15 as being identical. While the first, second, and third concavities are, strictly speaking, formed by the concavities 23a, 23b, and 23c, for the sake of convenience, the first, second, and third concavities may thus be considered to be formed by the concavities 15a, 15b, and 15c.

Furthermore, a longitudinal gap (in the direction of the Y axis) between neighboring anode plates 5 is extremely small as compared to the longitudinal length of each anode plate 5, and therefore the gap is not taken into consideration in the following calculations. Note that the film thickness of the hole transporting layers 9 in the sub-pixels is simply referred to as the film thickness of the hole transporting layer 9.

In one element-formation region, let the area of an ink-spraying region, i.e. the region where ink is sprayed on the anode plate 5 (the region indicated by reference number 5 in FIG. 3A), be S. Let the solute concentration of the ink used for the intermediate layer be N. Furthermore, let the amount of ink sprayed in one ink-spraying region (the hatched region C in FIG. 6) be V0, and let the volume of the concavity 15 formed on the anode plate 5 be V1 (with the volume of the concavities 15a, 15b, and 15c corresponding to each color respectively being V1a, V1b, and V1c).

FIGS. 7A, 7B, and 7C are greatly simplified versions of FIG. 6 schematically showing a state in which ink has been sprayed in the ink-spraying region (left side) and a state in which the ink has dried (right side). In the following explanation, the ink-spraying region, concavity 15, etc. are treated as simplified in FIGS. 7A-7C in order to consider the relationship between the volume of the concavity 15 and the film thickness of the hole transporting layer 9. Note that in FIGS. 7A-7C, the anode plate 5, pixel defining layer 6, etc. are omitted.

(1) Difference in Film Thickness of the Hole Transporting Layer 9 Depending on the Presence of the Concavity First, the relationship between the volume of the concavity 15 and the film thickness of the hole transporting layer 9 is described.

FIG. 7A shows states before and after drying of ink, assuming that no concavity 15 is formed. Assuming that the entire upper surface of the anode plate 5 is even, and that no concavity exists, the hypothetical height H0 of the ink layer sprayed on the anode plate 5 is obtained by dividing the amount of sprayed ink V0 by the area S.

$$H0 = V0/S \quad (1\text{-}1)$$

The hole transporting layer 9 that forms after drying has a hypothetical height of h0, obtained by multiplying the hypothetical height H0 of the ink layer by the solute concentration N.

$$h0 = N \times H0 \quad (1\text{-}2)$$
$$= N \times V0/S$$

FIGS. 7B and 7C show states before and after drying of ink when a concavity 15 is formed. Note that in FIGS. 7B and 7C, ink that enters in the concavity 15 and dries is distinguished from an ink layer that is above the concavity 15 and dries. Details regarding this distinction are provided below.

When a concavity 15 (volume V1) is formed on the anode plate 5, part of the ink that is sprayed fills the concavity 15. It is assumed that ink fills the entire concavity 15, as in the hatched region D in FIG. 6. The upper surface of the ink after spraying may to some extent be uneven, but in the following estimations, it is assumed that the upper surface is even.

The height H of the ink layer in the sub-pixels can thus be calculated in the same way when ink is sprayed on an anode plate with no concavity, using instead a remaining amount of ink V0−V1, i.e. the amount of sprayed ink V0 minus the amount of ink V1 that fills the concavity 15 (see FIG. 7B).

Accordingly, the height H of the ink layer is obtained by dividing the remaining amount of ink (V0−V1) by the area S.

$$H = (V0 - V1)/S \quad (1\text{-}3)$$

The film thickness h of the hole transporting layer 9 after the ink dries is obtained by multiplying the height H of the ink layer by the solute concentration N of the ink for the intermediate layer.

$$h = N \times H \quad (1\text{-}4)$$
$$= N(V0 - V1)/S$$

Figure 8A:
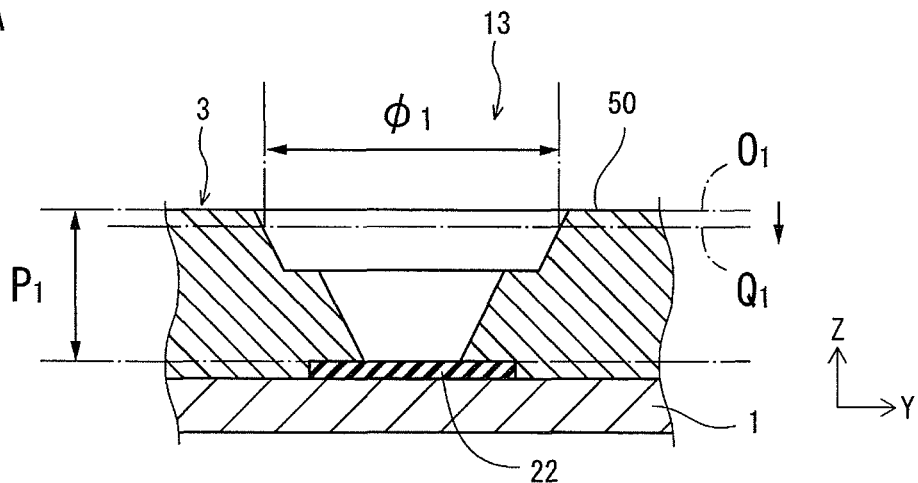
FIGS. 8A-8C illustrate the size of an upper opening of a contact hole 13.
Figure 8B:
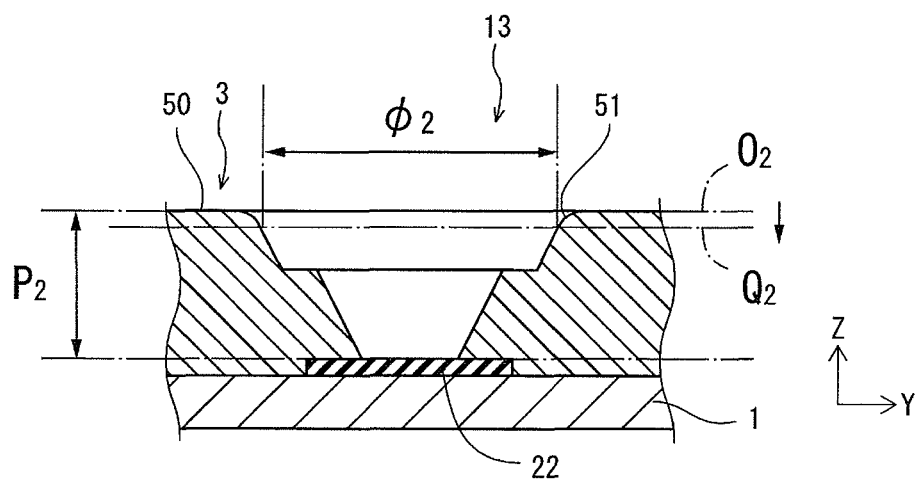

Comparing FIGS. 7A and 7B, it is clear that due to the concavity 15 being filled with ink, the height H of the ink layer in the sub-pixels is shorter than the hypothetical height H0 (indicated by the line J in FIG. 8B). As a result, the film thickness h of the hole transporting layer 9 after drying is less than the hypothetical height h0.

When it is assumed that no concavity 15 is formed on the anode plate 5, the hypothetical height h0 of the hole transporting layer 9 is N×V0/S. Accordingly, when comparing the film thickness h of the hole transporting layer 9 with the hypothetical film thickness h0, an amount E by which the film thickness h decreases due to the concavity 15 is obtained by the following equation.

$$E = h0 - h \quad (1\text{-}5)$$
$$= N \times V0/S - N(V0 - V1)/S$$
$$= N \times V1/S$$

In other words, the amount E of decrease in the film thickness h of the hole transporting layer 9 with respect to the hypothetical film thickness h0 is fundamentally based on the volume of the concavity 15. Accordingly, by increasing the volume (V1) of the concavity 15, the amount E of decrease in the film thickness h of the hole transporting layer 9 with respect to the hypothetical film thickness h0 increases.

The volumes V1a, V1b, and V1c of the concavities 15 of the different colors are ordered as follows: V1a>V1b>V1c. Therefore, if the amount of sprayed ink V0 and the solute concentration N are set to be the same, the film thickness of the hole transporting layer 9a in the blue sub-pixel is the thinnest, and the film thickness of the hole transporting layer 9c in the red sub-pixel is the thickest.

(2) Difference in Volume of Concavities 15 and Difference in Film Thickness of Hole Transporting Layers 9 Between Each Color FIGS. 7B and 7C indicate the heights Ha and Hb of the ink layers and the film thicknesses ha and hb of the hole transporting layers 9a and 9b. Note that for the sake of simplicity, in FIGS. 7A-7C, the anode plates 5 and other layers are omitted, and the cross-sectional shape of the concavity 15 is represented as a rectangle.

The following describes the relationship between (i) a difference ΔV1 between the volumes of the concavities 15a, 15b, and 15c and (ii) a difference in film thickness Δh between film thicknesses ha, hb, and hc of the hole transporting layers 9, with the concavities and the hole transporting layers corresponding to different colors.

Note that the amount of sprayed ink V0 and the solute concentration N are set to be equivalent between ink-spraying regions of different colors. Given these conditions, the difference in film thickness Δhab between the film thickness ha of the hole transporting layer 9a in the blue sub-pixel and the film thickness hb of the hole transporting layer 9b in the green sub-pixel is obtained by the following equation.

$$\Delta hab = ha - hb \qquad (2\text{-}1)$$
$$= N(V0 - V1a)/S - N(V0 - V1b)/S$$
$$= N(V1b - V1a)/S$$
$$= N \times \Delta V1ab/S$$

In other words, when the amount of ink V0 and the solute concentration N are equivalent in the ink-spraying regions of different colors, the above difference in film thickness Δhab is fundamentally proportional to the difference ΔV1ab in the volumes of the concavity 15a corresponding to the color blue and the concavity 15b corresponding to the color green. Accordingly, adjusting the difference ΔV1 between the volume of two of the concavities 15a, 15b, and 15c (for example, V1a−V1b) results in a corresponding difference in film thickness Δh between the film thicknesses, ha, hb, or hc, of the hole transporting layer 9 of two different colors (for example, ha−hb). In this embodiment, the volume V1a of the concavity 15a is larger than the volume V1b of the concavity 15b, and therefore V1a−V1b yields a negative value. This indicates that the film thickness ha is smaller than the film thickness hb.

Note that even if the amount of sprayed ink V0 and the solute concentration N vary by color, the difference in film thickness Δh can still be adjusted by the same principle.

(3) Units by which Difference in Film Thickness of Hole Transporting Layer 9 is Adjusted The size of each concavity 15 is defined by the size of the contact hole 13 formed on the interlayer insulation film 3, and it is possible to finely adjust the size of each concavity 15 as described below. Accordingly, the volume V1a, V1b, V1c of the concavities can be adjusted in finer increments than the volume of one drop of ink, thus allowing for fine adjustment to the difference in film thickness of the hole transporting layer 9 by color.

First of all, by way of comparative example, the following describes a method to adjust film thickness by changing the number of drops of ink sprayed in sub-pixels of different colors. Let the number of drops of ink sprayed in each ink-spraying region be M, and the volume of a drop of ink be V0/M, the amount of sprayed ink V0 divided by the number of drops of ink M. It follows that when the number of drops of ink sprayed in each ink-spraying region is increased or decreased by one drop (e.g. when comparing M drops vs. M+1 drops), the film thickness of the resulting intermediate layer changes by N(V0/M)/S. Therefore, the difference in film thickness can only be adjusted in increments equaling N(V0/M)/S.

The present Embodiment, on the other hand, allows for the difference in volume between the concavities 15a, 15b, 15c (e.g. V1a−V1b) to be adjusted in increments smaller than the volume of one drop of ink, i.e. V0/M (for example, in increments equaling half the volume of a drop of ink, i.e. V0/2M). Accordingly, the difference in film thickness Δh of the hole transporting layer 9 can be set, for example, to N(V0/2M)/S, which is smaller than the difference in film thickness when changing the number of drops of ink by one drop. Furthermore, the difference in film thickness Δh of the hole transporting layer 9 can, for example, be set larger than the difference in film thickness when the number of drops of ink is changed by n drops and smaller than the difference when the number of drops of ink is changed by n+1 drops.

Accordingly, the difference in film thickness Δhab between the film thickness ha of the hole transporting layer 9a in the blue sub-pixel and the film thickness hb of the hole transporting layer 9b in the green sub-pixel can (i) be set larger than the increase in the film thickness ha of the hole transporting layer 9a when the number of drops of ink dripped in the blue sub-pixel is increased by n drops, and (ii) be set smaller than the increase in the film thickness ha of the hole transporting layer 9a when the number of drops of ink is increased by n+1 drops.

(4) Portion of the Hole Transporting Layer 9 that Enters into the Concavity 15

As shown in FIGS. 7B and 7C, the film thickness of the hole transporting layer 9 in the concavity 15 is generally thicker than the film thickness of the hole transporting layer 9 in the sub-pixel. This is due to ink that fills the concavity 15.

In the lower half of FIG. 6, the amount (volume) v3 of the hole transporting layer 9 that enters the concavity 15 indicates the volume of the portion between lines E and F. Therefore, the volume of the hole transporting layer 9 that enters the concavity 15 is expressed as the amount of the hole transporting layer 9 that is formed in the same region as the concavity 15 in plan view.

Returning to FIGS. 7B and 7C, the amount (volume) v3 of the hole transporting layer 9 that enters the concavity 15 is the sum of volumes v1 and v2. The volume v1 is the volume of a first portion 42 formed when a first ink portion 41 (volume V1) that fills the concavity 15 dries, and the volume v2 is the volume of a second portion 44 formed when a second ink portion 43 (volume V2) of the ink layer located above the concavity 15 dries.

$$v3 = v1 + v2 \qquad (3\text{-}1)$$

The volumes v1 and v2 are represented by the following equations.

$$v1 = N \times V1 \qquad (3\text{-}2)$$

$$v2 = N \times V2 \qquad (3\text{-}3)$$

As shown in FIGS. 7B and 7C, within the portion of the hole transporting layer 9 that enters the concavity 15, the second portion 43, from which the second portion 44 forms, simply changes in accordance with the height H of the ink layer in the sub-pixel, and is considered not to contribute to a change in the film thickness h of the hole transporting layer 9. This is also clear from equation (1-5).

Accordingly, within the volume v3 of the hole transporting layer 9 that enters the concavity 15, the volume that contributes to a change in the film thickness h of the hole transporting layer 9 is the volume v1 of the first portion 42. By adjusting the volume V1 of the concavity 15, the volume v1 of the first portion 42 can be appropriately adjusted, thereby adjusting the film thickness h of the hole transporting layer 9.

Furthermore, by finely adjusting the difference between the volume V1a and V1b of the respective first ink portions 41a and 41b of the different colors, the difference in the volume v1a and v1b of the first portions 42 is appropriately adjusted, thereby finely adjusting the difference in film thickness of the hole transporting layers 9a, 9b, 9c in the respective sub-pixels of different colors.

In practice, however, it is difficult to separate the hole transporting layer 9 that enters into the concavity 15 into the first portion 42 and the second portion 44. Therefore, based on the amount of the hole transporting layer 9 in the sub-pixel, a corresponding volume v2' that corresponds to the volume v2 of the second portion 44 is calculated.

In this context, the height of the second ink portion 43 is the same as the height H of the ink layer 45 in the sub-pixel. Accordingly, letting the size of the upper opening of the concavity 15 be S1, a volume v4 per area S1 of the hole transporting layer 9 in the sub-pixel (as indicated by reference number 46) corresponds to the volume v2 of the second portion 44, and thus equals the corresponding volume v2'.

The above volume v4 is calculated by multiplying the film thickness h of the hole transporting layer 9 in the sub-pixel by the area S1. Note that a mean film thickness of the hole transporting layer 9 in the sub-pixel may be used as the film thickness h. Specifically, the film thickness of the hole transporting layer 9 in the sub-pixel may be measured in a plurality of locations, and the mean of the measurements calculated as the film thickness h.

$$v2' = v4 \qquad (3\text{-}4)$$
$$= h \times S1$$

The corresponding volume v2' of the second ink portion 43 is thus obtained, allowing for calculation of a corresponding volume v1' of the first ink portion 41. Note that a corresponding volume v3', corresponding to the total volume v3, may for example be calculated based on a cross-section of the hole transporting layer 9 that enters into the concavity 15. Specifically, when a cross-section that includes a central axis of the concavity 15 is obtained, the corresponding volume v3' can be considered to be the volume of a solid of revolution obtained by rotating the cross-sectional shape of the hole transporting layer 9 once about the central axis.

$$v1' = v3' - v2' \qquad (3\text{-}5)$$
$$= v3' - h \times S1$$

Note that ideally, the corresponding volume v1' and the volume v1 obtained by multiplying the volume V1 of the concavity 15a by the solute concentration N are approximately equal (for example, in a range of ±10%).

The size of the upper opening S1 of the concavity 15 is defined in the same way as the size of the upper opening of the contact hole 13, as described below. Specifically, the size of the upper opening S1 may be considered as the area of a circle defined by the diameter of the concavity 15 at a position 10% lower than the highest position along the periphery of the concavity 15.

In the present Embodiment, (i) the volume (V1a) of the first contact hole (13a) is larger than the volume (V1b) of the second contact hole (13b); (ii) the volume of the first organic functional layer (9a) corresponding to a region above the electrode plate (5a) of the first color (for example, N×V0) is equal to, or an approximation of, the volume of the second organic functional layer (9b) corresponding to a region above the electrode plate (5b) of the second color (for example, N×V0); and (iii) the volume (v3a) of the first organic functional layer that enters into the first concavity (15a) corresponding to the first contact hole is larger than the volume (v3b) of the second organic functional layer that enters into the second concavity (15b) corresponding to the second contact hole, so that the film thickness (ha) of the first organic functional layer is less, in a region other than the first concavity on the electrode plate corresponding to the first color (for example, 9a in the blue sub-pixel), than the film thickness (hb) of the second organic functional layer in a region other than the second concavity on the electrode plate corresponding to the second color (for example, 9b in the green sub-pixel).

Furthermore, in the present Embodiment, (i) the volume (V1a) of the first contact hole (13a) is larger than the volume (V1b) of the second contact hole (13b); and (ii) the difference (v3a−v2a=v1a) between the volume (v3a) of the first organic functional layer (9a) that enters into the first concavity (15a) in the electrode plate (for example, 5a) of the first color and the volume (v2a) of a portion of the first organic functional layer corresponding to a portion other than the first concavity in the electrode plate (5a) of the first color (for example, 9a in the blue sub-pixel), the portion having the same width (size of the upper opening S1) in plan view as the first concavity, is larger than (iii) the difference (v3b−v2b=v1b) between the volume (v3b) of the second organic functional layer (9b) that enters into the second concavity (15b) in the electrode plate (for example, 5b) of the second color and the volume (v2b) of a portion of the second organic functional layer corresponding to a portion other than the second concavity in the electrode plate (5b) of the second color (for example, 9b in the green sub-pixel), the portion having the same width (size of the upper opening S1) in plan view as the second concavity.

Note that the above volumes in parenthesis v1, v2, and v3 may be the above-described corresponding volumes v1', v2', and v3'.

In the present Embodiment, the hole transporting layer 9a in the blue sub-pixel corresponds to the first organic functional layer, the hole transporting layer 9b in the green sub-pixel corresponds to the second organic functional layer, and the hole transporting layer 9c in the red sub-pixel corresponds to the third organic functional layer.

It may also be considered that the hole transporting layer 9a in the blue sub-pixel corresponds to the first organic functional layer, and the hole transporting layer 9c in the red sub-pixel corresponds to the second organic functional layer. Furthermore, it may be considered that the hole transporting layer 9b in the green sub-pixel corresponds to the first organic functional layer, and the hole transporting layer 9c in the red sub-pixel corresponds to the second organic functional layer.

(5) The Following is a Consideration of a Specific, Numerical Example.

For example, in one sub-pixel, let the size of the ink-spraying region on the anode plate 5 (regions shown by reference numbers 5a-5c in FIG. 3A) be 300 μm long and 70 μm wide, and the area of the ink-spraying region on the anode plate 5 be S=21000 μm².

Furthermore, let the solute concentration N of the ink for the intermediate layer be 0.02 (2 vol %) and the drop amount of one drop of ink ejected by the inkjet be 3 pL, and let seven drops of ink be ejected on the anode plate 5 in each sub-pixel, so that V0, the quantity of ink that fills each ink-spraying region, equals 21 pL (21000 μm³).

If there is no concavity in the anode plate 5, the hypothetical height H0 of the ink layer on the anode plate 5 is V0/S=1 μm (=1000 nm), and the film thickness h0 of the hole transporting layer 9 that forms after drying is obtained by the following equation.

$$h0 = N \times H0 \qquad (4\text{-}1)$$
$$= 0.02\ \mu m$$
$$= 20\ nm$$

The concavity 15a corresponding to the color blue is a circular truncated cone in which the upper radius is larger than the lower radius. The upper radius r1 is set to 20 μm, the lower radius r2 to approximately 17.7 μm, the height T to 4 μm, and the inclination angle of the side wall (inclination angle with respect to the X-Y plane) to 60°. Accordingly, the volume V1a of the concavity 15a is 4468 μm³ (4.468 pL), as obtained by the following equation, with a value of 3.14 used for π.

$$V1 = \pi \times T(r_1^2 + r_1 \times r_2 + r_2^2)/3 \qquad (4\text{-}2)$$

As a result, the film thickness ha of the hole transporting layer 9a in the blue sub-pixel is obtained by the following equation.

$$ha = N(V0 - V1a)/S = 15.7 \text{ nm} \qquad (4\text{-}3)$$

The concavity 15b corresponding to the color green is formed by an upper circular truncated cone and a lower circular truncated cone, the upper circular truncated cone having a larger diameter. The volumes of the two cones are calculated separately. In the upper circular truncated cone, the upper radius is set to 20 μm, the lower radius to approximately 19.1 μm, the height to 1.5 μm, and the inclination angle of the side wall (inclination angle with respect to the X-Y plane) to 60°. In the lower circular truncated cone, the upper radius is set to 15 μm, the lower radius to approximately 13.6 μm, the height to 1.5 μm, and the inclination angle of the side wall (inclination angle with respect to the X-Y plane) to 60°.

The volume of the upper circular truncated cone is 1800 μm³ (1.800 pL), and the volume of the lower circular truncated cone is 1607 μm³ (1.607 pL). Accordingly, the volume V1b of the concavity 15b is 3407 μm³ (3.407 pL). As a result, the film thickness hb of the hole transporting layer 9b in the green sub-pixel is obtained by the following equation.

$$hb = N(V0 - V1b)/S = 16.8 \text{ nm} \qquad (4\text{-}4)$$

The concavity 15c corresponding to the color red is also formed by an upper circular truncated cone and a lower circular truncated cone, the upper circular truncated cone having a larger diameter. The volumes of the two cones are calculated separately. In the upper circular truncated cone, the upper radius is set to 20 μm, the lower radius to approximately 19.1 μm, the height to 1.5 μm, and the inclination angle of the side wall (inclination angle with respect to the X-Y plane) to 60°. In the lower circular truncated cone, the upper radius is set to 10 μm, the lower radius to approximately 8.6 μm, the height to 2.5 μm, and the inclination angle of the side wall (inclination angle with respect to the X-Y plane) to 60°.

The volume of the upper circular truncated cone is 1800 μm³ (1.800 pL), and the volume of the lower circular truncated cone is 680 μm³ (0.680 pL). Accordingly, the volume V1c of the concavity 15c is 2480 μm³ (2.480 pL). As a result, the film thickness hc of the hole transporting layer 9c in the red sub-pixel is obtained by the following equation.

$$hc = N(V0 - V1c)/S = 17.6 \text{ nm} \qquad (4\text{-}5)$$

Accordingly, the difference in film thickness Δhab between the film thickness ha of the hole transporting layer 9a in the blue sub-pixel and the film thickness hb of the hole transporting layer 9b in the green sub-pixel is 1.0 nm. The difference in film thickness Δhbc between the film thickness hb and the film thickness hc is approximately 0.9 nm. Furthermore, the difference in film thickness Δhac between the film thickness ha and the film thickness hc is approximately 1.9 nm. In the above case, the difference in volume ΔV1 of the contact holes 13 is as follows: ΔV1ab (the difference between blue and green) and ΔV1bc (the difference between green and red) is approximately 1000 μm³ (1 pL), and ΔV1ac (the difference between blue and red) is approximately 2000 μm³ (2 pL).

The difference in film thickness of the hole transporting layer 9 between sub-pixels of different colors can thus be adjusted in fine increments (for example, equal to or less than 1 nm).

On the other hand, in the comparative example, when the number of drops of ink that are dripped into each sub-pixel in a comparative example is increased or decreased by one drop, the film thickness of the intermediate layer that forms increases or decreases by 2.9 nm. Therefore, adjustments to the film thickness can only be made in 2.9 nm increments.

As described above, the method of manufacturing the display panel 100 according to the present embodiment allows for the difference in film thickness of the hole transporting layer 9 between sub-pixels of different colors to be finely adjusted relatively easily by adjusting the volume of the concavities 15a, 15b, and 15c formed in the sub-pixels of different colors in finer increments than the volume of a drop of ink. As a result, the film thickness of the hole transporting layer 9 in each sub-pixel can easily be set to a value that matches the wavelength of the luminescent color in the sub-pixel, thus improving light takeoff efficiency.

Note that in the above calculation example, the inclination angle (taper angle) of the side wall of the contact hole 13 is set to 60°, but the inclination angle is not limited in this way, and may be set to any angle. Furthermore, the inclination angle may differ between the upper portion and the lower portion.

The above difference in film thickness Δh is not limited to 1 nm or 2 nm, but in response to conditions may be set, for example, to less than 1 nm, or at least 3 nm.

The upper radius of the contact hole 13 is not limited to 20 μm, but may be set to any value, for example at least 25 μm.

So as not to influence the height or shape of the banks 8, it is preferable for the opening at the top of the contact hole 13 to be formed in a region that is separated from the banks 8 in plan view.

It is preferable that the difference in volume ΔV1 between contact holes 13 corresponding to different colors be larger than the tolerance of the volume of the contact hole 13a. For example, if the volume of the contact hole 13a is 4500 μm³, and the tolerance is 10%, it is preferable for the difference in volume ΔV1ab to exceed 450 μm³.

(Regarding the Size of the Upper Opening)

The following describes the size of the upper opening of the contact hole 13.

In the present Embodiment, the size of the upper opening of each of the contact holes 13a, 13b, and 13c is set to be substantially equal. The size of the upper opening of the contact holes 13 is the area of a circle defined by the diameter of the contact hole 13 at a position 10% lower than the highest position along the periphery of the contact hole 13.

Figure 8C:
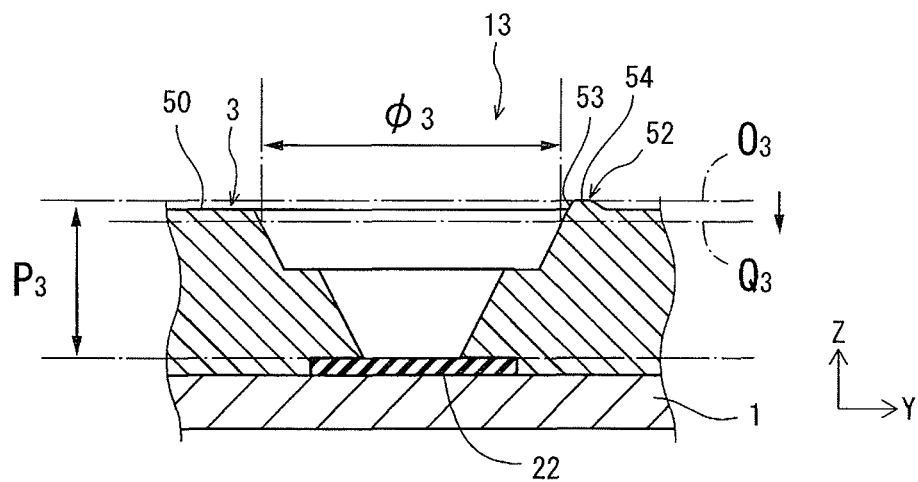

FIGS. 8A, 8B, and 8C schematically show cross-sections of the contact holes 13 (note that cross-sections of the contact hole 13b are shown as representative examples). In each of the figures, the shape of the periphery of the contact hole 13 differs. The following describes how the diameter of the contact hole 13 is defined in these cases.

In FIG. 8A, the highest position along the periphery of the contact hole 13 is the same height as the upper surface 50 of the interlayer insulation film 3 (line O1). A position 10% lower refers to a position that is lower by 10% of the depth P1 of the contact hole 13 (P1/10), which is represented by the line Q1. Accordingly, in FIG. 8A, the distance between the two points of intersection between the line Q1 and the side wall of the contact hole 13 is the diameter φ1 of the contact hole 13.

As a result, the size of the upper opening of the contact hole 13 is, for example, the area of a circle with diameter φ1.

In FIG. 8B, the edge of the opening of the contact hole 13 is a curve 51. In this case, the curve 51 can be considered as forming part of the periphery of the contact hole 13, with the highest position along the curve 51 being the height of the upper surface 50 of the interlayer insulation film 3. A position 10% lower refers, like Q1, to a position (Q2) that is lower from the upper surface 50 of the interlayer insulation film 3 by 10% of the depth P2 (P2/10). Accordingly, in FIG. 8B, the distance between the two points of intersection between the line Q2 and the side wall of the contact hole 13 is the diameter φ2 of the contact hole 13.

In FIG. 8C, a protrusion 52 is formed next to the contact hole 13. As shown in the figure, if the side wall 53 of the protrusion 52 is considered to be part of the side wall of the contact hole 13, the position of the top 54 of the protrusion 52 corresponds to the highest position along the periphery of the contact hole 13. In this case, the depth P3 of the contact hole 13 is the distance from the top 54 of the protrusion 52 to the bottom. A position 10% lower than the highest position therefore refers to a position (Q3) that is lower from the top 54 by 10% of the depth P3 (P3/10). Accordingly, in FIG. 8C, the distance between the two points of intersection between the line Q3 and the side wall of the contact hole 13 is the diameter φ3 of the contact hole 13.

(Regarding Optical Path Length)

Figure 9:
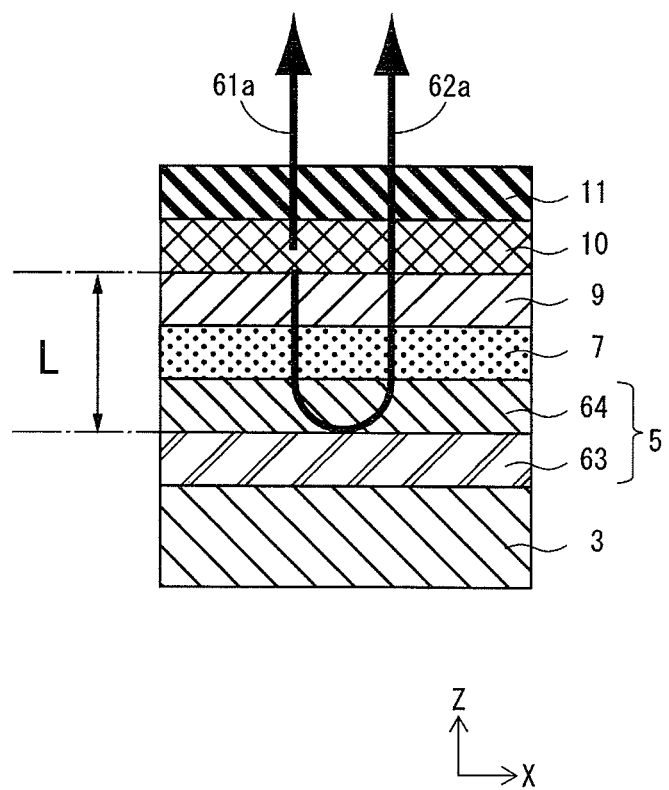
FIG. 9 is a schematic diagram illustrating the progression of light in an organic EL element 20.

FIG. 9 is a cross-section diagram schematically showing a path of light in the organic EL element 20. FIG. 9 shows directly released light 61, which is emitted directly from the light-emitting layer 10 towards the cathode layer 11, and reflected light 62, which is released after being reflected at the anode plate 5. Note that in FIG. 9, the anode plate 5 is shown divided into a metal layer 63 and a transparent electrode layer 64 (IZO). In this case, the reflective surface of the anode plate 5 is the main surface of the metal layer 63 at the side of the transparent electrode layer 64.

In FIG. 9, the resonance condition of light in the organic EL element 20 can be optimized for the optical path length of, for example, the hole transporting layer 9, hole-injection layer 7, and transparent electrode layer 64. This structure is referred to as a cavity, or a cavity structure.

In the present Embodiment, the difference in path length may be adjusted either by changing only the film thickness of the hole transporting layer 9, or by additionally adjusting the film thickness of the hole-injection layer 7, the transparent electrode layer 64, etc.

The following is a simple description of a method for determining the difference in volume between contact holes. For example, a prototype of an organic EL display panel is manufactured, and in order to optimize the resonance condition of light for each color, it is determined how to change the difference in film thickness between the organic functional layer of each color, or whether to change the overall film thickness while maintaining the difference in film thickness between organic functional layers. An organic EL display panel is then manufactured under the same conditions (ink spraying conditions) as the prototype, changing the volume of the contact holes. The resonance conditions of light in the organic EL elements are thus optimized, yielding an organic EL display panel with high luminous efficiency.

<Modification 1>

In the above Embodiment, the contact holes 13b and 13c have an upper portion and a lower portion, the lower portion having a different upper radius. Alternatively, the volume of the contact hole 13 may be varied by changing the depth of the upper portion and the lower portion.

Figure 10:
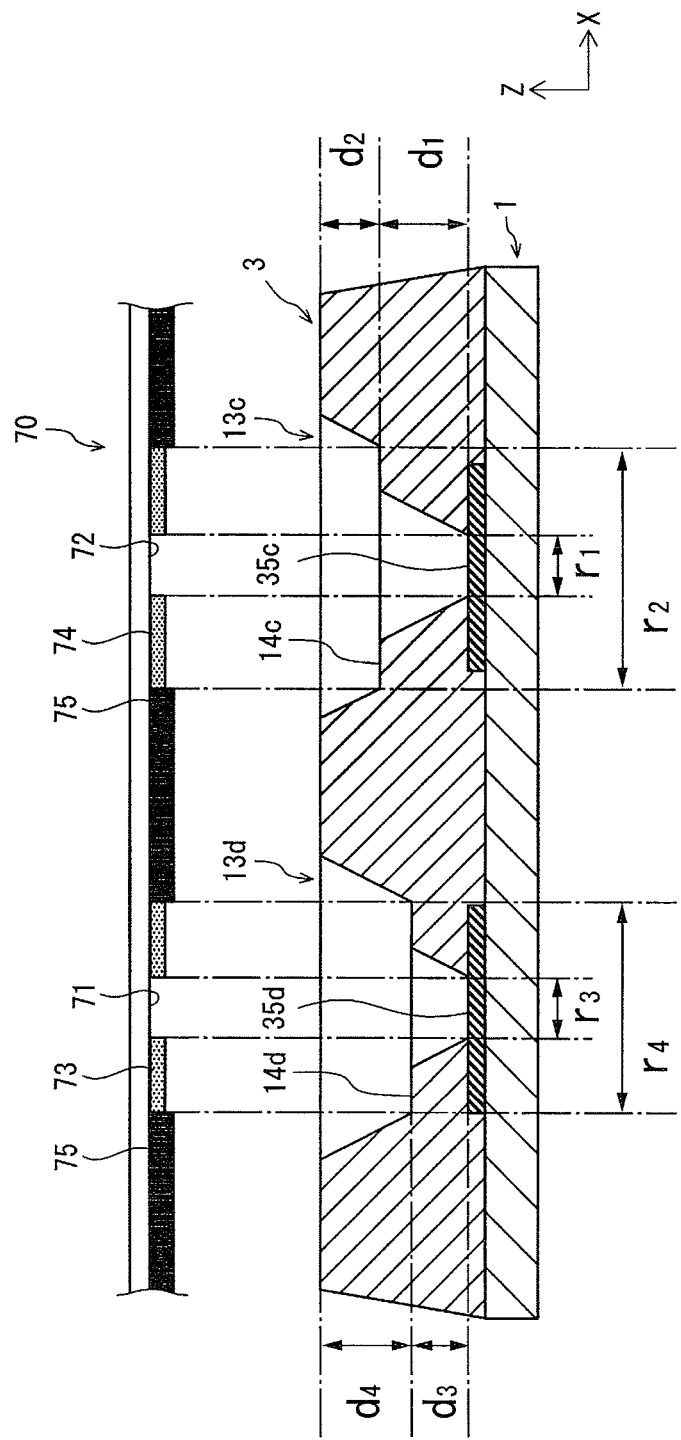
FIG. 10 is a schematic diagram showing a shape of a contact hole 13d according to Modification 1.

FIG. 10 is a cross-section diagram schematically showing portions of FIG. 3B corresponding to the contact holes 13b and 13c. In this figure, instead of the contact hole 13b as in the above Embodiment, a contact hole 13d is formed. The contact hole 13c is the same as in FIG. 3B.

In the contact hole 13d of the present Modification, the upper portion that is above the step surface 14d is deeper than the upper portion of contact hole 13c. As a result, the volume of the contact hole 13d is less than the volume of the contact hole 13a and larger than the volume of the contact hole 13c.

The following describes a multi-tone pattern mask used during exposure to form the contact holes 13c and 13d of the present Modification.

A multi-tone mask 70 is formed by transparent portions 71 and 72 that let light pass through, a first semi-transparent portion 73 with a low degree of transparency, a second semi-transparent portion 74 with a lower degree of transparency than the first semi-transparent portion 73, and a light blocking portion 75 that blocks light. The transparent portion 71 and first semi-transparent portion 73 correspond to the contact hole 13d, and the transparent portion 72 and second semi-transparent portion 74 correspond to the contact hole 13c.

The planar shapes (shapes of the openings in plan view) of the transparent portions 71 and 72 are approximately the same as the bottom shapes (35d, 35c) of the contact holes 13d and 13c. The peripheral outline of the planar shape of the first semi-transparent portion 73 is approximately the same as the bottom shape of the upper portion of the contact hole 13d (shape of the step surface 14d). Similarly, the peripheral outline of the planar shape of the second semi-transparent portion 74 is approximately the same as the bottom shape of the upper portion of the contact hole 13c (shape of the step surface 14c).

Light that passes through the first semi-transparent portion 73 is brighter than light that passes through the second semi-transparent portion 74. A deeper portion of the resist film 26 (see FIG. 5A) is therefore exposed, resulting in a deeper upper portion of the contact hole 13d.

In the present Modification, the upper depths (d2, d4) and lower depths (d1, d3) differ between contact holes 13. By decreasing the upper depths (d2, d4), the volume of the contact hole 13 may be decreased.

In this Modification, the bottom radii r1 and r3 are set to be equivalent in the contact holes 13d and 13c. When the bottom radii (r1, r3) are thus set to be equivalent in the contact holes 13, the contact area between each of the anode plates 5 and each of the SD electrodes 22 is equivalent.

Note that the bottom radii (r2, r4) of the upper portions are determined by the inclination angle of the side wall and by the diameter of the circle that defines the size of the upper opening.

Furthermore, the upper depths (d2, d4) and lower depths (d1, d3) as well as the bottom radii (r1, r3) may be varied between the contact holes 13. The inclination angle of the side wall may also be varied.

Furthermore, while in the Embodiment and Modification 1, the contact holes 13b, 13c, and 13d are divided into an upper and lower portion with one step surface 14, the contact holes may have a plurality of step surfaces and thus be divided into three or more portions.

<Modification 2>

In the Embodiment and Modification 1, the difference in film thickness between the hole transporting layers 9 is finely adjusted by changing the volume of the contact hole 13 corresponding to each color, but the difference in film thickness between the light-emitting layers 10, which are an example of an organic functional layer, may also be finely adjusted.

In the present Modification, a difference in volume between the contact holes 13a, 13b, and 13c leads to a difference in film thickness between the light-emitting layers 10a, 10b, and 10c of the sub-pixels of different colors. As a result, it is easier to achieve appropriate luminance and chromaticity for the light-emitting layer 10 of each color. The resonance conditions of light in the organic EL element 20 are also appropriately adjusted, thus improving light takeoff efficiency. Note that the number of drops of ink, which includes organic light-emitting material, that are sprayed in the sub-pixel of each color may first be varied, and then the difference in film thickness may further be finely adjusted by a difference in volume between the contact holes 13.

In the present modification, hole transporting layers may be formed by the vacuum deposition method or the sputtering method. The hole transporting layers may also be formed by the inkjet method, or the hole transporting layers may be omitted.

When forming hole-injection layers by the inkjet method, the difference in the film thickness thereof may be finely adjusted. In this case, an organic material such as PEDOT-PSS, an aromatic amine series high-polymer material, polyphenylene vinylene, etc. may be used as the material for the hole-injection layer.

[Other]

1. Example of Structure of Display Device

Figure 11:
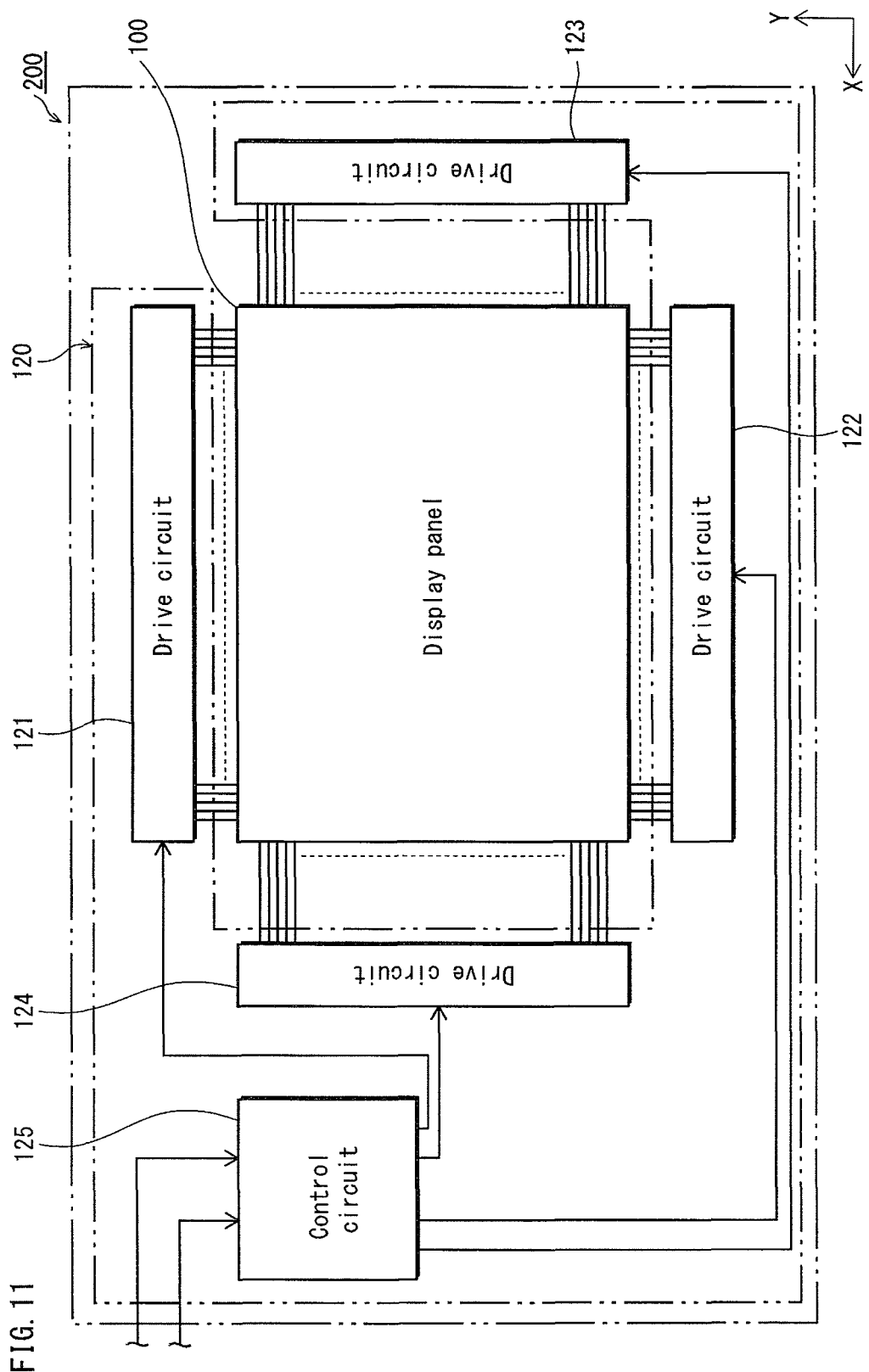
FIG. 11 is a diagram showing the overall structure of a display device 200 according to the Embodiment.

FIG. 11 shows the structure of a display device 200 provided with the display panel 100.

Figure 12:
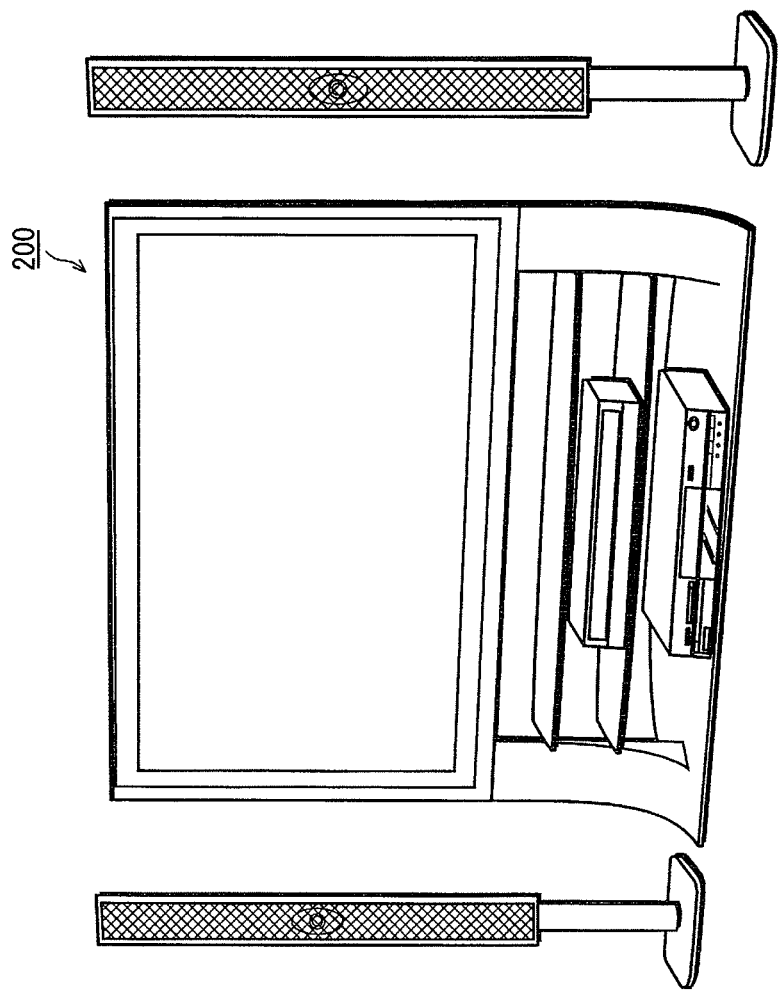
FIG. 12 is an appearance profile of an example of a television system that includes the display device 200.

FIG. 12 is an appearance profile of an example of a television system that includes the display device 200.

The display device 200 includes an organic EL display panel 100 and a drive control unit 120 connected thereto. The drive control unit 120 is composed of four drive circuits 121-124 and a control circuit 125. A power supply unit, not shown in the figures, supplies the drive control unit 120 with power.

The TFT layer 2 is provided with signal wiring lines corresponding to each column and scanning wiring lines corresponding to each row of the matrix of organic EL elements 20. The signal wiring lines extend in the direction of the Y axis, are connected to each least one of the drive circuit 121 and the drive circuit 122, and are connected to the TFTs of the organic EL elements 20 in each column. The scanning wiring lines extend in the direction of the X axis, are connected to each least one of the drive circuit 123 and the drive circuit 124, and are connected to the TFTs of the organic EL elements 20 in each row.

2. In the above Embodiment and Modifications, structures are adopted by way of example in order to clearly illustrate a structure of the present invention and the effects and advantages thereof. Except for its essential elements, the present invention is not limited to the above structures. For example, in the above Embodiment, as shown in FIG. 1, a structure is adopted by way of example in which anode plates 5 are located below the light-emitting layer 10 in the direction of the Z axis. The present invention is not limited, however, to this structure; a structure may be adopted in which cathodes are located below the organic light-emitting layer 10 in the direction of the Z axis.

3. In the above Embodiment and Modifications, a top-emission structure may be adopted, wherein the anode plates 5 are a reflective metal, and the cathode layer 11 a transparent or semi-transparent metal. Alternatively, a bottom-emission structure may be adopted, wherein the anode plates 5 are a transparent or semi-transparent metal, and the cathode layer 11 a reflective metal.

4. In the above Embodiment and Modifications, use of active matrix driving with the TFT layer 2 on the substrate is assumed, but the present invention is also applicable to passive matrix driving. In this case, no TFT layer is necessary, and current can be provided to the organic light-emitting layer by driving lines that drive the organic light-emitting layer.

5. In the above Embodiment and Modifications, the pixel defining layer 6 is formed between the anode plate 5 and the hole-injection layer 7, but alternatively the pixel defining layer 6 may be formed above the hole-injection layer 7.

6. The above Embodiment describes an example in which the hole transporting layer is formed on the anode plate 5 as an intermediate layer by the wet method. However, when a hole-injection layer, or a hole injection and transporting layer, is formed as an intermediate layer by the wet method, the film thickness of the intermediate layer may similarly be finely adjusted to efficiently yield light of each luminescent color.

7. In the above Embodiment and Modifications, when the hole transporting layer 9 and the light-emitting layer 10 are both sprayed by the inkjet method, the difference in film thickness between sub-pixels of different colors may be adjusted by adjusting both the hole transporting layer 9 and the light-emitting layer 10.

INDUSTRIAL APPLICABILITY

The organic EL display panel according to the present invention can be used as a display in electronic devices such as cellular phones, televisions, etc.

REFERENCE SIGNS LIST 1 substrate
2 TFT layer
3 interlayer insulation film
5 (5a-5c) anode plate
6 pixel defining layer
7 (7a-7c) hole injection layer
8 (8a-8c) banks
9 (9a-9c) intermediate layer
10 (10a-10c) organic light-emitting layer
11 cathode layer
13 (13a-13c) contact hole
14 step surface
15 (15a-15c) concavity
20a-20c organic EL elements
22 SD electrode
23 (23a-23c) concavity
100 display panel

The invention claimed is:

1. An organic EL display panel comprising:
a TFT layer;
an interlayer insulation film provided above the TFT layer;
a first electrode plate group formed in a line on the interlayer insulation film and including a plurality of first electrode plates corresponding to a first color;
a second electrode plate group formed in a line on the interlayer insulation film adjacent to the first electrode plate group and including a plurality of second electrode plates corresponding to a second color;
a first bank along a longitudinal first edge of the first electrode plate group;
a second bank between a longitudinal second edge of the first electrode plate group and a longitudinal first edge of the second electrode plate group;
a third bank along a longitudinal second edge of the second electrode plate group;

a first organic functional layer between the first bank and the second bank and above the first electrode plate group;

a second organic functional layer between the second bank and the third bank and above the second electrode plate group; and a counter electrode disposed to cover both the first organic functional layer and the second organic functional layer, wherein the interlayer insulation film is provided with first contact holes, each connecting one of the first electrode plates with the TFT layer, and second contact holes, each connecting one of the second electrode plates with the TFT layer, each of the first electrode plates has a first concavity shaped in conformity with one of the first contact holes, and each of the second electrode plates has a second concavity shaped in conformity with one of the second contact holes, at least one of (i) all the first contact holes and (ii) all the second contact holes are shaped to become narrower in a stepwise manner, any of the first contact holes has a larger volume than any of the second contact holes, the volume of a portion of the first organic functional layer above any of the first electrode plates is equal to, or an approximation of, the volume of a portion of the second organic functional layer above any of the second electrode plates, and an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

2. The organic EL display panel of claim 1, wherein
a size of an upper opening of each of the first contact holes is equal to, or an approximation of, a size of an upper opening of each of the second contact holes.

3. The organic EL display panel of claim 2, wherein
the size of the upper opening of any contact hole is the area of a circle defined by a diameter of the contact hole at a position 10%, or an approximation of 10%, lower than a height of a highest position of the interlayer insulation film along a periphery of the contact hole.

4. The organic EL display panel of claim 1, further comprising:
a first pixel defining layer covering the first concavity, the first organic functional layer being formed above the first pixel defining layer; and
a second pixel defining layer covering the second concavity, the second organic functional layer being formed above the second pixel defining layer.

5. The organic EL display panel of claim 1, wherein
the first organic functional layer is continuous above the first electrode plate group due to ink drops of a predetermined volume being sprayed via an inkjet method,
the second organic functional layer is continuous above the second electrode plate group due to ink drops of the predetermined volume, or an approximation of the predetermined volume, being sprayed via the inkjet method, and
the volume of the portion of the first organic functional layer above any of the first electrode plates is equal to, or an approximation of, the volume of the portion of the second organic functional layer above any of the second electrode plates.

6. The organic EL display panel of claim 5, wherein
a difference between the film thickness of the first organic functional layer and the film thickness of the second organic functional layer is larger than an additional film thickness of the first organic functional layer when a number of ink drops of the predetermined volume sprayed on each of the first electrode plates via the inkjet method is increased by n drops, and smaller than an additional film thickness of the first organic functional layer when the number of ink drops is increased by n+1 drops.

7. The organic EL display panel of claim 1, wherein
the first color is blue.

8. The organic EL display panel of claim 1, further comprising
a third electrode plate group adjacent to the second electrode plate group and including a plurality of third electrode plates corresponding to a third color and arranged in a line;
a fourth bank along a longitudinal edge of the third electrode plate group opposite the second electrode plate group; and
a third organic functional layer between the third bank and the fourth bank and above the third electrode plate group; wherein
the counter electrode is provided above the third organic functional layer,
the interlayer insulation film is provided with third contact holes, each connecting one of the third electrode plates with the TFT layer,
each of the third electrode plates has a third concavity shaped in conformity with one of the third contact holes,
the third contact holes are shaped to become narrower in a stepwise manner,
any of the first contact holes has a larger volume than any of the third contact holes,
the volume of a portion of the first organic functional layer above any of the first electrode plates is equal to, or an approximation of, the volume of a portion of the third organic functional layer above any of the third electrode plates, and
an amount of the first organic functional layer that has entered into the first concavity is larger than an amount of the third organic functional layer that has entered into the third concavity, so that a film thickness of the first organic functional layer in a region other than the first concavity in any of the first electrode plates is less than a film thickness of the third organic functional layer in a region other than the third concavity in any of the third electrode plates.

9. The organic EL display panel of claim 8, wherein
a size of an upper opening of each of the first contact holes, a size of an upper opening of each of the second contact holes, and a size of an upper opening of each of the third contact holes are equal to, or an approximation of, each other.

10. The organic EL display panel of claim 9, wherein
the size of the upper opening of any contact hole is the area of a circle defined by a diameter of the contact hole at a position 10% lower than a height of a highest position of the interlayer insulation film along a periphery of the contact hole.

11. The organic EL display panel of claim 1, wherein
the first organic functional layer and the second organic functional layer are both one of a charge injection layer and a charge transport layer,
a first organic light-emitting layer is formed between the first organic functional layer and the counter electrode, and
a second organic light-emitting layer is formed between the second organic functional layer and the counter electrode.

12. The organic EL display panel of claim 8, wherein
the first organic functional layer, the second organic functional layer, and the third organic functional layer are all one of a charge injection layer and a charge transport layer,
a first organic light-emitting layer is formed between the first organic functional layer and the counter electrode,
a second organic light-emitting layer is formed between the second organic functional layer and the counter electrode, and
a third organic light-emitting layer is formed between the third organic functional layer and the counter electrode.

13. The organic EL display panel of claim 1, wherein
the first organic functional layer and the second organic functional layer are each an organic light-emitting layer.

14. The organic EL display panel of claim 8, wherein
the first organic functional layer, the second organic functional layer, and the third organic functional layer are each an organic light-emitting layer.

15. The organic EL display panel of claim 1, wherein
the electrode plates are anodes, and the counter electrode is a cathode.

16. The organic EL display panel of claim 1, wherein
the electrode plates are cathodes, and the counter electrode is an anode.

17. A display device comprising the organic EL display panel of claim 1.

18. A method of manufacturing an organic EL display panel comprising the steps of:
a first step of preparing a substrate;
a second step of forming a TFT layer on the substrate;
a third step of forming an interlayer insulation film on the TFT layer;
a fourth step of forming, on the interlayer insulation film, a first electrode plate group including a plurality of first electrode plates corresponding to a first color and arranged in a line and a second electrode plate group including a plurality of second electrode plates corresponding to a second color and arranged in a line;
a fifth step of forming a first bank along a longitudinal first edge of the first electrode plate group, a second bank between a longitudinal second edge of the first electrode plate group and a longitudinal first edge of the second electrode plate group, and a third bank along a longitudinal second edge of the second electrode plate group;
a sixth step of forming a continuous first organic functional layer between the first bank and the second bank and above the first electrode plate group;
a seventh step of forming a continuous second organic functional layer between the second bank and the third bank and above the second electrode plate group; and
an eighth step of forming a counter electrode to cover both the first organic functional layer and the second organic functional layer, wherein
in the third step, the interlayer insulation film is provided with first contact holes, each connecting one of the first electrode plates with the TFT layer, and second contact holes, each connecting one of the second electrode plates with the TFT layer, at least one of (i) all the first contact holes and (ii) all the second contact holes being shaped to become narrower in a stepwise manner, and any of the first contact holes having a larger volume than any of the second contact holes,
in the fourth step, each of the first electrode plates is formed to have a first concavity shaped in conformity with one of the first contact holes, and each of the second electrode plates is formed to have a second concavity shaped in conformity with one of the second contact holes, and
in the first organic functional layer formed in the sixth step and the second organic functional layer formed in the seventh step,
the volume of a portion of the first organic functional layer above any of the first electrode plates is equal to, or an approximation of, the volume of a portion of the second organic functional layer above any of the second electrode plates, and
an amount of the first organic functional layer that has entered into the first concavity is larger than an amount of the second organic functional layer that has entered into the second concavity, so that a film thickness of the first organic functional layer in a region other than the first concavity in any of the first electrode plates is less than a film thickness of the second organic functional layer in a region other than the second concavity in any of the second electrode plates.

19. The method of manufacturing an organic EL display panel of claim 18, wherein
a size of an upper opening of each of the first contact holes is formed equal to, or an approximation of, a size of an upper opening of each of the second contact holes.

20. The method of manufacturing an organic EL display panel of claim 18, further comprising, between the fourth step and the fifth step, an additional step of:
forming a first pixel defining layer to cover the first concavity, and a second pixel defining layer to cover the second concavity, wherein
in the sixth step, the first organic functional layer is formed above the first pixel defining layer, and
in the seventh step, the second organic functional layer is formed above the second pixel defining layer.

21. The method of manufacturing an organic EL display panel of claim 18, wherein
in the sixth step, the first organic functional layer is formed to be continuous above the first electrode plate group due to ink drops of a predetermined volume being sprayed via an inkjet method, and
in the seventh step, the second organic functional layer is formed to be continuous above the second electrode plate group due to ink drops of the predetermined volume, or an approximation of the predetermined volume, being sprayed via the inkjet method.

22. The method of manufacturing an organic EL display panel of claim 21, wherein
a difference between the film thickness of the first organic functional layer and the film thickness of the second organic functional layer is larger than an increase in the film thickness of the first organic functional layer when a number of ink drops of the predetermined volume sprayed on each of the first electrode plates via the inkjet method is increased by n drops, and smaller than the increase in the film thickness of the first organic functional layer when the number of ink drops is increased by n+1 drops.

23. The method of manufacturing an organic EL display panel of claim 18, wherein
the first organic functional layer and the second organic functional layer are both one of a charge injection layer and a charge transport layer,
a first organic light-emitting layer is formed between the first organic functional layer and the counter electrode, and
a second organic light-emitting layer is formed between the second organic functional layer and the counter electrode.

24. The method of manufacturing an organic EL display panel of claim 18, wherein
the first organic functional layer and the second organic functional layer are each an organic light-emitting layer.

25. A method of manufacturing an organic EL display panel comprising the steps of:
a first step of preparing a substrate;
a second step of forming a TFT layer on the substrate;
a third step of forming an interlayer insulation film on the TFT layer;
a fourth step of forming, on the interlayer insulation film, a first electrode plate group including a plurality of first electrode plates corresponding to a first color and arranged in a line, a second electrode plate group including a plurality of second electrode plates corresponding to a second color and arranged in a line, and a third electrode plate group including a plurality of third electrode plates corresponding to a third color and arranged in a line;
a fifth step of forming a first bank along a longitudinal first edge of the first electrode plate group, a second bank between a longitudinal second edge of the first electrode plate group and a longitudinal first edge of the second electrode plate group, a third bank between a longitudinal second edge of the second electrode plate group and a longitudinal first edge of the third electrode plate group, and a fourth bank along a longitudinal second edge of the third electrode plate group;
a sixth step of forming a continuous first organic functional layer between the first bank and the second bank and above the first electrode plate group;
a seventh step of foaming a continuous second organic functional layer between the second bank and the third bank and above the second electrode plate group;
an eighth step of forming a continuous third organic functional layer between the third bank and the fourth bank and above the third electrode plate group; and
a ninth step of forming a counter electrode disposed to cover the first organic functional layer, the second organic functional layer, and the third organic functional layer, wherein
in the third step, the interlayer insulation film is provided with first contact holes, each connecting one of the first electrode plates with the TFT layer, second contact holes, each connecting one of the second electrode plates with the TFT layer, and third contact holes, each connecting one of the third electrode plates with the TFT layer, at least two of (i) all the first contact holes, (ii) all the second contact holes, and (iii) all the third contact holes being shaped to become narrower in a stepwise manner, and any of the first contact holes having a larger volume than any of the second contact holes and any of the third contact holes,
in the fourth step, each of the first electrode plates is formed to have a first concavity shaped in conformity with one of the first contact holes, each of the second electrode plates is formed to have a second concavity shaped in conformity with one of the second contact holes, and each of the third electrode plates is formed to have a third concavity shaped in conformity with one of the third contact holes, and
in the first organic functional layer formed in the sixth step, the second organic functional layer formed in the seventh step, and the third organic functional layer formed in the eighth step,
the volume of a portion of the first organic functional layer above any of the first electrode plates is equal to, or an approximation of, the volume of a portion of the second organic functional layer above any of the second electrode plates and the volume of a portion of the third organic functional layer above any of the third electrode plates, and
an amount of the first organic functional layer that has entered into the first concavity is larger than both an amount of the second organic functional layer that has entered into the second concavity and an amount of the third organic functional layer that has entered into the third concavity, so that a film thickness of the first organic functional layer in a region other than the first concavity in any of the first electrode plates is less than both a film thickness of the second organic functional layer in a region other than the second concavity in any of the second electrode plates and a film thickness of the third organic functional layer in a region other than the third concavity in any of the third electrode plates.

* * * * *